(12) United States Patent
Hummert et al.

(10) Patent No.: US 12,501,822 B2
(45) Date of Patent: *Dec. 16, 2025

(54) COORDINATION COMPLEX AND ELECTRONIC DEVICE COMPRISING THE SAME

(71) Applicant: Novaled GmbH, Dresden (DE)

(72) Inventors: Markus Hummert, Dresden (DE); Ulrich Heggemann, Dresden (DE); Thomas Rosenow, Dresden (DE); Ulrike Schliebe, Dresden (DE)

(73) Assignee: Novaled GmbH, Dresden (DE)

( * ) Notice: Subject to any disclaimer, the term of this patent is extended or adjusted under 35 U.S.C. 154(b) by 274 days.

This patent is subject to a terminal disclaimer.

(21) Appl. No.: 18/337,575

(22) Filed: Jun. 20, 2023

(65) Prior Publication Data
US 2023/0354695 A1 Nov. 2, 2023

Related U.S. Application Data

(62) Division of application No. 16/955,826, filed as application No. PCT/EP2018/086085 on Dec. 20, 2018, now abandoned.

(30) Foreign Application Priority Data

Dec. 20, 2017 (EP) ..................... 17209023

(51) Int. Cl.
| | |
|---|---|
| H10K 50/155 | (2023.01) |
| C07F 3/02 | (2006.01) |
| C07F 3/06 | (2006.01) |
| C07F 13/00 | (2006.01) |
| H10K 50/17 | (2023.01) |
| H10K 71/40 | (2023.01) |
| H10K 85/30 | (2023.01) |

(52) U.S. Cl.
CPC ............ *H10K 85/381* (2023.02); *C07F 3/02* (2013.01); *C07F 3/06* (2013.01); *C07F 13/005* (2013.01); *H10K 85/30* (2023.02); *H10K 85/341* (2023.02); *H10K 50/155* (2023.02); *H10K 50/17* (2023.02); *H10K 71/441* (2023.02)

(58) Field of Classification Search
CPC ...... H10K 50/15; H10K 85/30; H10K 85/341; C07F 3/06
See application file for complete search history.

(56) References Cited

U.S. PATENT DOCUMENTS

| | | | |
|---|---|---|---|
| 3,920,444 A | 11/1975 | Harrington et al. | |
| 6,528,187 B1 | 3/2003 | Okada | |
| 8,329,989 B2 | 12/2012 | Salbeck et al. | |
| 9,722,183 B2 | 8/2017 | Fadhel et al. | |
| 11,201,306 B2 * | 12/2021 | Heggemann | C07F 3/02 |
| 11,239,440 B2 * | 2/2022 | Heggemann | H10K 85/657 |
| 11,322,710 B2 * | 5/2022 | Heggemann | H10K 85/322 |
| 11,696,493 B2 * | 7/2023 | Hummert | C07F 3/06 428/690 |
| 2009/0179553 A1 | 7/2009 | Yakuschenko et al. | |

FOREIGN PATENT DOCUMENTS

| | | |
|---|---|---|
| CN | 101437920 A | 5/2009 |
| EP | 1970371 A1 | 9/2008 |
| EP | 3133663 A1 | 2/2017 |
| EP | 3133664 A1 | 2/2017 |
| JP | H1115176 A * | 1/1999 |
| JP | 2000144125 A | 5/2000 |
| KR | 20100093076 A | 8/2010 |

OTHER PUBLICATIONS

Nobuaki et al. JP-H1115176-A (1999), English machine translation, retrieved from J-Plat Pat on May 17, 2025. (Year: 1999).*
PCT International Search Report and Written Opinion for PCT Application No. PCT/EP2018/086085 mailed Feb. 28, 2019 (13 pages).
Hamura et al., "Polymerization of Ethylene Catalyzed by Novel Titanium and Zirconium Sulfonamide Complexes," Engineering Sciences Rports, Kyushu University, 2001, 23(1):15-20.
Mincione et al., "Carbonic Anhydrase Inhibitors, Part 46 Inhibition of Carbonic Anhydrase Isomers I, II and IV with Trifluoromethylsulfonamide Derivatives and Their Zinc(II) and Copper(II) Complexes," Metal-Based Drugs, 1997, 4(1):27-34.

(Continued)

*Primary Examiner* — Amanda L. Aguirre
(74) *Attorney, Agent, or Firm* — Eversheds Sutherland (US) LLP

(57) ABSTRACT

The present invention relates to an electronic device comprising a hole injection layer and/or a hole transport layer and/or a hole generating layer, wherein at least one of the hole injection layer, the hole transport layer and the hole generating layer comprises a coordination complex comprising at least one electropositive atom M having an electro-negativity value according to Allen of less than 2.4 and at least one ligand L having the following structure:

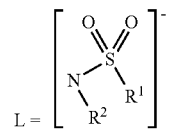

wherein $R^1$ and $R^2$ are independently selected from the group, consisting of $C_1$ to $C_{30}$ hydrocarbyl groups and $C_2$ to $C_{30}$ heterocyclic groups, wherein $R^1$ and/or $R^2$ may optionally be substituted with at least one of CN, F, Cl, Br and I.

16 Claims, 3 Drawing Sheets

(56) References Cited

OTHER PUBLICATIONS

Shirota et al., "Charge Carrier Transporting Molecular Materials and Their Applications in Devices," Chem. Rev., 2007, 107:953-1010.
Office Action issued in corresponding Taiwan application No. 107146192, dated Jul. 4, 2022, 14 pages.
Notice of Reasons for Refusal issued in Japan application No. 2020-534453, mailed Aug. 30, 2022, 14 pages.
Ma, Yuguang et al., A blue electroluminescent Molecular device from atetranucluear zinc(II) compound [Zn4O(AID) 6] (AID=7-azaindolate) Chem. Commun., Britain, Royal Society of Chemistry, Dec. 31, 1998, pp. 2491-2492.
European Summons to Attend Oral Proceedings for European application No. 17209035.5, mailed Apr. 16, 2021, 8 pages.
Cheng et al., "Organic Light-Emitting Devices Based on Solution-Processible Quinolato-Complex Supramolecules," Materials Chemistry and Physics, 2009, 113:1003-1008.
European Office Action issued in European Application No. 17209035.5 mailed Apr. 3, 2020, 7 pages.
Haiduc "Inverse Coordination—An Emerging New Chemical Concept. Oxygen and Other Chalogens as Coordination Centers," Coordination Chemistry Reviews, 2017, 338:1-26.
Haiduc "Inverse Coordination—An Emerging New Chemical Concept. II. Halogens as Coordination Centers," Coordination Chemistry Reviews, 2017, 348:71-91.

\* cited by examiner

COORDINATION COMPLEX AND ELECTRONIC DEVICE COMPRISING THE SAME

CROSS REFERENCE TO RELATED APPLICATIONS

This application is a divisional of U.S. patent application Ser. No. 16/955,826, filed Jun. 19, 2020, which is a U.S. national stage entry of international application no. PCT/EP2018/086085, filed Dec. 20, 2018, which claims priority to European Patent Application No. 17209023.5, filed Dec. 20, 2017. The content of these applications is incorporated by reference herein.

FIELD OF THE DISCLOSURE

The present invention relates to an electronic device comprising a coordination complex, the respective coordination complex, a method for preparing the same, a semiconducting material comprising the coordination complex and a solid crystalline phase consisting of the coordination complex.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

Organic electronic devices comprising trifluoromethanesulfonimide (TFSI) metal complexes are known in the art. Furthermore, for example, U.S. Pat. No. 6,528,137 B1 discloses sulfonylamide complexes for use in the emitting layer or an electron transport layer of an organic light emitting diode.

However, there is still a need to improve the performance of electronic devices, in particular to select suitable materials to be comprised in organic hole transport layers, organic hole injection layers or hole generating materials helpful to improve the performance of a respective electronic device.

It is, therefore, the object of the present invention to provide an electronic device and a method for preparing the same overcoming drawbacks of the prior art, in particular to provide electronic devices comprising an organic hole transport material, an organic hole injection material or a hole generating material, the electronic devices having improved performance, in particular reduced operational voltage and/or improved efficiency, in particular in OLEDs.

SUMMARY OF THE INVENTION

The above object is achieved by an electronic device comprising a hole injection layer and/or a hole transport layer and/or a hole generating layer, wherein at least one of the hole injection layer, the hole transport layer and the hole generating layer comprises a coordination complex comprising at least one electropositive atom M having an electro-negativity value according to Allen of less than 2.4 and at least one ligand L having the following structure:

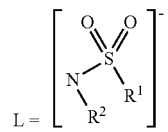

wherein $R^1$ and $R^2$ are independently selected from the group, consisting of $C_1$ to $C_{30}$ hydrocarbyl groups and $C_2$ to $C_{30}$ heterocyclic groups, wherein $R^1$ and/or $R^2$ may optionally be substituted with at least one of CN, F, Cl, Br and I.

It was surprisingly found by the inventors that an electronic device comprising a coordination complex as defined above in a hole injection layer, a hole transport layer or a hole generating layer thereof shows superior properties over devices of the prior art, in particular with respect to operational voltage and quantum efficiency. Further advantages are apparent from the specific examples presented herein.

In the inventive electronic device, the coordination complex may have the general formula (I)

wherein Q is a ligand different from L; n is from 1 to 4; m is from 1 to 6; p is from 0 to 6; and l is 0 or 1. Respective choices allow fine tuning of the electronic structure of the inventive coordination complex to improve the usability thereof in hole injection layers, hole transport layers or hole generating layers of electronic devices.

In the electronic device, M may be selected from metals forming divalent and/or trivalent cations. In this regard, the term "forming divalent and/or trivalent cations" refers to the formation of cations which are stable under standard conditions.

More specifically, it is to be understood that a metal forming a divalent cation is an element having electronegativity according to Allen of less than 2.4, which is known to occur in oxidation state (+II) in at least one compound which is at the temperature 25° C. thermodynamically and/or kinetically stable enough that it could be prepared and the oxidation state (+II) for the element could be proven. Analogously, it is to be understood that a metal forming a trivalent cation is an element having electronegativity according to Allen of less than 2.4, which is known to occur in oxidation state (+III) in at least one compound which is at the temperature 25° C. thermodynamically and/or kinetically stable enough that it could be prepared and the oxidation state (+III) for the element could be proven. As typical elements forming divalent cations can be considered elements of the second and twelfth group of the Periodic Table, transition metals, Sn and Pb. As typical elements forming trivalent cations can be considered elements of the third and thirteenth group of the Periodic Table, inner transition metals, Sb and Bi. Respective choices allow fine tuning of the electronic structure of the inventive coordination complex to improve the usability thereof in hole injection layers, hole transport layers or hole generating layers of electronic devices.

M may be selected from metals forming divalent cations. Respective choices allow fine tuning of the electronic structure of the inventive coordination complex to improve the usability thereof in hole injection layers, hole transport layers or hole generating layers of electronic devices.

M may be selected from the group consisting of Ti, Cr, Mn, Fe, Co, Ni, Zn, and Cu. Respective choices allow fine tuning of the electronic structure of the inventive coordination complex to improve the usability thereof in hole injection layers, hole transport layers or hole generating layers of electronic devices.

M may be selected from the group consisting of Mn, Fe, Co, Ni, and Zn. Respective choices allow fine tuning of the electronic structure of the inventive coordination complex to improve the usability thereof in hole injection layers, hole transport layers or hole generating layers of electronic devices.

In the inventive electronic device $R^1$ and/or $R^2$ may be substituted with substituents selected from the group consisting of CN, F, Cl, Br, and I and in at least one of $R^1$ and $R^2$ the number ratio of substituents:hydrogen is $\geq 1$; alternatively $\geq 2$, alternatively $\geq 3$; alternatively $\geq 4$; alternatively $\geq 9$. Respective choices allow fine tuning of the electronic structure of the inventive coordination complex to improve the usability thereof in hole injection layers, hole transport layers or hole generating layers of electronic devices.

In the inventive electronic device, both $R^1$ and/or $R^2$ may be substituted with substituents selected from the group consisting of CN, F, Cl, Br, and I, wherein in each of $R^1$ and $R^2$, the number ratio of substituents:hydrogen is $\geq 1$; alternatively $\geq 2$, alternatively $\geq 3$; alternatively $\geq 4$; alternatively $\geq 9$. Respective choices allow fine tuning of the electronic structure of the inventive coordination complex to improve the usability thereof in hole injection layers, hole transport layers or hole generating layers of electronic devices.

In the inventive electronic device $R^1$ and/or $R^2$ may be fully substituted with substituents selected from the group consisting of CN, F, Cl, Br and I. Respective choices allow fine tuning of the electronic structure of the inventive coordination complex to improve the usability thereof in hole injection layers, hole transport layers or hole generating layers of electronic devices.

In the inventive electronic device $R^1$ and/or $R^2$ may be perhalogenated. Respective choices allow fine tuning of the electronic structure of the inventive coordination complex to improve the usability thereof in hole injection layers, hole transport layers or hole generating layers of electronic devices.

In the inventive electronic device $R^1$ and/or $R^2$ may be perfluorinated. Respective choices allow fine tuning of the electronic structure of the inventive coordination complex to improve the usability thereof in hole injection layers, hole transport layers or hole generating layers of electronic devices.

In the inventive electronic device $R^1$ may be selected from saturated hydrocarbyl groups; alternatively halogenated alkyl groups or halogenated cycloalkyl groups; alternatively perhalogenated alkyl groups or perhalogenated cycloalkyl groups; alternatively perfluorinated alkyl groups or perfluorinated cycloalkyl groups. Respective choices allow fine tuning of the electronic structure of the inventive coordination complex to improve the usability thereof in hole injection layers, hole transport layers or hole generating layers of electronic devices.

In the inventive electronic device $R^2$ may be selected from the group consisting of $C_6$ to $C_{30}$ aromatic groups and $C_2$ to $C_{30}$ heteroaromatic groups, wherein $R^2$ may optionally be substituted with one or more halogen atoms; alternatively $R^2$ is selected from perhalogenated $C_6$ to $C_{30}$ aromatic groups or perhalogenated $C_2$ to $C_{30}$ heteroaromatic groups, alternatively $R^2$ is selected from perfluorinated $C_6$ to $C_{30}$ aromatic groups or $C_2$ to $C_{30}$ heteroaromatic groups. Respective choices allow fine tuning of the electronic structure of the inventive coordination complex to improve the usability thereof in hole injection layers, hole transport layers or hole generating layers of electronic devices.

In the inventive electronic device m may be 2; alternatively n is 3; alternatively n is 4. Respective choices allow fine tuning of the electronic structure of the inventive coordination complex to improve the usability thereof in hole injection layers, hole transport layers or hole generating layers of electronic devices.

In the inventive electronic device the coordination complex may be an inverse coordination complex comprising (i) a core consisting of one atom or a plurality of atoms forming a covalent cluster; and (ii) a first coordination sphere consisting of at least four electropositive atoms M, wherein all core atoms have a higher electronegativity according to Allen than any of the electropositive atoms M in the first coordination sphere, and the at least one ligand L is coordinated to at least one atom of the first coordination sphere. Respective choices allow fine tuning of the electronic structure of the inventive coordination complex to improve the usability thereof in hole injection layers, hole transport layers or hole generating layers of electronic devices.

This coordination complex having the three features (i) to (iii) and the structure described above is referred herein as an "inverse coordination complex". With regard to interatomic interaction which is typically mirrored by equilibrium distance between the interacting atoms, the relationship between the core and the first coordination sphere in inverse coordination complexes is the same as in normal coordination complexes. In other words, in couples of closest atoms of the entire complex, wherein the first atom of the couple belongs to the core and the second atom of the couple belongs to the first coordination sphere, the distance between the first and the second atom is equal to or shorter than the sum of van der Waals radii of the first and of the second atom. The term "inverse" encompasses the circumstance that whereas in normal complexes an electropositive central atom is surrounded by more electronegative atoms of respective ligands, in inverse coordination complexes, the electronegative atoms of the core are surrounded by more electropositive atoms of the first coordination sphere.

The inverse coordination complex may be electrically neutral.

In the inverse coordination complex, the electropositive atoms may independently be selected from elements having an electronegativity according to Allen which is lower than 2.4, alternative lower than 2.3, alternatively lower than 2.2, alternatively lower than 2.1, alternatively lower than 2.0, alternatively lower than 1.9.

The electropositive atoms may independently be selected from metal atoms in the oxidation state (II), alternatively from transition metals of the fourth period of the periodic table of elements in the oxidation state (II), alternatively from Ti, Cr, Mn, Fe, Co, Ni, Zn, and Co in the oxidation state (II), alternatively from Mn, Fe, Co, Ni, Zn respectively in the oxidation state (II), alternatively are Zn (II).

In the inverse coordination complex the core may consist of atoms having an electronegativity according to Allen higher than 1.7, alternatively higher than 1.8, alternatively higher than 1.9, alternatively higher than 2.0, alternatively higher than 2.1, alternatively higher than 2.2, alternatively higher than 2.3 and alternatively higher than 2.4.

In the inverse coordination complex, the core may consist of one atom in a negative oxidation state, alternatively of a chalcogen atom in the oxidation state (–II), alternatively chalcogen atoms which may be selected from O, S, Se and Te in the oxidation state (–II), alternatively from O (–II) and S (–II), alternatively the core is a single O (–II) atom.

In the inverse coordination complex, the first coordination sphere may consist of four metal atoms in the oxidation state (II) tetrahedrally coordinated to the core.

In the inverse coordination complex, the second coordination sphere may consist of a plurality of ligands having the structure L.

In the inverse coordination complex, at least one ligand L of the second coordination sphere may be coordinated to two different metal atoms of the first coordination sphere.

In the inverse coordination complex, the core may consist of one chalcogen atom selected from O, S, Se and Te in the oxidation state (–II), the first oxidation sphere may consist of four metal atoms in the oxidation state (II) tetrahedrally coordinated to the core and the second coordination sphere may consist of six ligands having the structure L.

In the inverse coordination complex, each ligand L may be coordinated to two different metal atoms of the first coordination sphere.

In the inverse coordination complex, the N-atom, the S-atom and one of the O-atoms of the sulfonylamide group of each ligand L may form with two metal atoms M and M' of the first coordination sphere and with one core atom X a six-membered ring having the following formula (Ia)

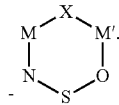

(Ia)

In the inverse coordination complex, $R^1$ and $R^2$ may be as defined as above.

In all of the foregoing embodiments with respect to the inverse coordination complex, each respective selection may be helpful for fine tuning of the electronic structure of the inverse coordination complex to improve the usability thereof in organic semiconducting layers of organic electronic devices.

The object is further achieved by a method for preparing the inventive inverse coordination complex the method comprising heating a complex having the general formula $(ML_2)$.

The inventive method for preparing the inventive coordination complex may comprise evaporation of the complex under reduced pressure.

The method may further comprise a step of depositing the evaporated complex on a solid support.

The object is further achieved by a coordination complex having the general formula (I)

$M_n L_m$

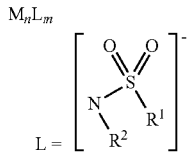

(I)

wherein n is 1 and m is 2 or 3;
wherein $R^1$ and $R^2$ are independently selected from the group consisting of $C_1$ to $C_{30}$ hydrocarbyl and $C_2$ to $C_{30}$ heterocyclic group, wherein $R^1$ and $R^2$ are each substituted with substituents selected from the group consisting of CN, F, Cl, Br and I and the ratio of substituents:hydrogen in each of the $R^1$ and $R^2$ is ≥1.

It was surprisingly found by the inventors that a respective coordination complex is suitable to improve the performance of electronic devices when being used therein, in particular in the hole transport/hole injection or hole generation part thereof.

In the inventive coordination complex, the ratio of substituents:hydrogen in each of the $R^1$ and $R^2$ may be ≥2; alternatively ≥3; alternatively ≥4; alternatively ≥9. Respective choices allow fine tuning of the electronic structure of the inventive coordination complex to improve the usability thereof in hole injection layers, hole transport layers or hole generating layers of electronic devices.

In the inventive coordination complex, $R^1$ and/or $R^2$ may be fully substituted with substituents independently selected from CN, F, Cl, Br and/or I. Respective choices allow fine tuning of the electronic structure of the inventive coordination complex to improve the usability thereof in hole injection layers, hole transport layers or hole generating layers of electronic devices.

In the inventive coordination complex, $R^1$ and/or $R^2$ may be perhalogenated. Respective choices allow fine tuning of the electronic structure of the inventive coordination complex to improve the usability thereof in hole injection layers, hole transport layers or hole generating layers of electronic devices.

In the inventive coordination complex, $R^1$ and/or $R^2$ may be perfluorinated. Respective choices allow fine tuning of the electronic structure of the inventive coordination complex to improve the usability thereof in hole injection layers, hole transport layers or hole generating layers of electronic devices.

In the inventive coordination complex, m may be 2. Respective choices allow fine tuning of the electronic structure of the inventive coordination complex to improve the usability thereof in hole injection layers, hole transport layers or hole generating layers of electronic devices.

In the inventive coordination complex, M may be selected from the group consisting of Ti, Cr, Mn, Fe, Co, Ni, Zn, and Cu. Respective choices allow fine tuning of the electronic structure of the inventive coordination complex to improve the usability thereof in hole injection layers, hole transport layers or hole generating layers of electronic devices.

In the inventive coordination complex, M may be selected from the group consisting of Mn, Fe, Co, Ni, and Zn; alternatively M may be Zn. Respective choices allow fine tuning of the electronic structure of the inventive coordination complex to improve the usability thereof in hole injection layers, hole transport layers or hole generating layers of electronic devices.

The object is further achieved by a method for preparing an inventive electronic device comprising a step of heating the coordination complex as defined above.

The method for preparing the electronic device may further comprise the steps of
(ii) vaporizing the coordination complex; and
(iii) depositing the vapor of the coordination complex on a solid support.

Furthermore, the vaporizing and the depositing may respectively comprise co-vaporizing and compositing of the coordination complex with a matrix material.

The object is further achieved by an electronic device obtainable by the inventive method for preparing an electronic device. This embodiment of the invention mirrors the fact that composition and/or structure of the coordination complexes comprising at least one sulfonylamide ligand L may change during heating of the complex and especially during its vaporization, as demonstrated below on the example of compounds E2 and E3.

Furthermore, the object is achieved by a semiconducting material comprising a hole transport matrix material and a p-dopant which is the coordination complex as defined above or the inverse coordination complex defined above.

Furthermore, the object is achieved by a solid crystalline phase consisting of a compound E3 having the chemical formula $C_{42}F_{48}N_6O_{13}S_6Zn_4$.

The solid crystalline phase may have a monoclinic crystal lattice belonging to the space group P 1 21 1.

At temperature 296.15 K, the solid crystalline phase may have the following unit cell dimensions:

α=14.1358 (5) Å, α=90°; b=16.0291 (6) Å, β=113.2920 (10); c=15.9888 (6) Å; γ=90°.

In the solid crystalline phase, the number of molecules having the chemical formula $C_{42}F_{48}N_6O_{13}S_6Zn_4$ and comprised in the unit cell of the crystal lattice may be Z=2.

In the solid crystalline phase, the unit cell volume at temperature 296.15 K, may be 3327.6 (2) Å$^3$ and calculated density may be 2.158 g/cm$^3$.

Finally, the object is achieved by a solid crystalline phase consisting of a compound E5 having the chemical formula $C_{54}H_{18}F_{54}N_6O_{13}S_6Zn_4$.

The solid crystalline phase may have a monoclinic crystal lattice belonging to the space group P 21/c.

At temperature 170 K, the solid crystalline phase may have the following unit cell dimensions:

α=15.5665 (3) Å, α=90°; b=18.1036 (4) Å, β=100.610 (1); c=29.0763 (6) Å; γ=90°.

In the solid crystalline phase, the number of molecules having the chemical formula $C_{54}H_{18}F_{54}N_6O_{13}S_6Zn_4$ and comprised in the unit cell of the crystal lattice may be Z=4.

In the solid crystalline phase, the unit cell volume at temperature 170 K may be 8053.9 (3) Å$^3$ and calculated density may be 2.011 g/cm$^3$.

In accordance with the invention, it may be provided that coordination complexes having the composition $ML_n$ with n being 1, 2 or 3, L being a ligand having the structure L above and $R^2$ being a heterocyclic group comprising a trivalent hetero atom selected from N, P and As or a divalent hetero atom selected from O, S, Se or Te are excluded from the scope of the invention.

Alternatively, metal complexes may be excluded from the invention, wherein the metal complexes have a composition $ML_n$, wherein n is 1, 2 or 3 and L is a ligand having the above structure L with $R^2$ being a heterocyclic group comprising the trivalent or divalent heteroatom in such position that the heteroatom coordinates to the M atom of the complex to form a 5-, 6- or 7-membered chelate ring. Alternatively, said metal complexes with n=2 may be excluded from the scope of the invention. Alternatively, said metal complexes may be excluded in which M is Zn. Alternatively, said metal complexes may be excluded in which L is substituted or unsubstituted quinolin-8-yl. Alternatively, said metal complexes may be excluded in which L is quinolin-8-yl. In the following, the present invention will be explained in more detail referring to one specific embodiment.

DETAILED DESCRIPTION OF THE INVENTION

A zinc complex having composition $M^2L_2$ and supposed structure E2, with an electron withdrawing ligand L with a perfluorophenyl group bound to a nitrogen, has been prepared. Further detailed studies on E2, however, revealed that its sublimation is in fact accompanied by a chemical change, because the sublimed complex differs in its structure and composition from the starting material. More specifically, the sublimed material partly formed monocrystals of a size and quality suitable for X-ray diffraction (XRD); the structure and composition of this material, assigned herein as E3, has been fully resolved by this method.

The XRD revealed that the sublimed material has an unexpected composition $Zn_4OL_6$ and a cluster structure E3 shown in FIG. 4.

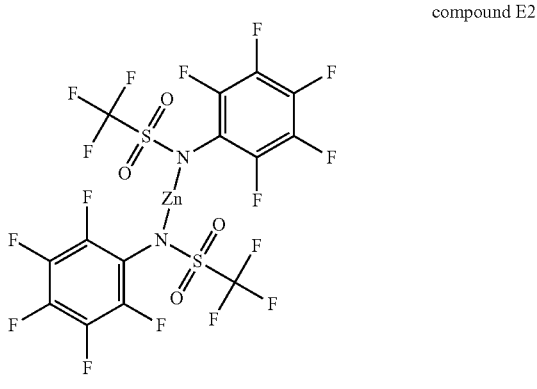

compound E2

Due to complexity of this molecule E3 having summary formula $C_{42}F_{48}N_6O_{13}S_6Zn_4$, the structure shall be described in the next paragraph in form of a guide:

The molecule consists of the central oxide dianion, tetrahedrally coordinated with four Zn dications, bridged with six monoanionic ligands L (which are per se structurally identical as in formula E2) in the way that on each edge of the central $Zn_4$ tetrahedron, one L is bound to both Zn cations through its N and O atoms, respectively, forming thus with both Zn cations and the central oxide dianion a six-membered —Zn—O—Zn—N—S—O— ring.

In the present application, the prior art compound B2

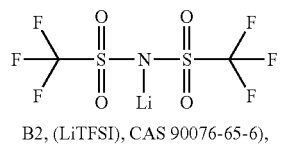

B2, (LiTFSI), CAS 90076-65-6), known for use in organic light emitting diodes of the prior art, in particular in hole injection materials thereof or as p-dopant, has been used as the reference material to show superiority of the inventive materials.

Further Layers

In accordance with the invention, the electronic device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either the first electrode or the second electrode may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

In accordance with the invention, the hole injection layer may comprise or consist of a coordination complex (respectively an inverse coordination complex) as described above in very detail. The hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed—if the electronic device comprises besides the hole injection layer and/or a hole generating layer and the hole transport layer and/or the hole generating layer comprises the (inverse) coordination complex—of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

In such a case, the HIL may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinodimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis (phenyl)-benzidine) doped with F4TCNQ. α-NPD doped with 2,2'-(perfluoronaphthalen-2,6-diylidene) dimalononitrile (PD1). α-NPD doped with 2,2',2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

In accordance with the invention, the hole transport layer may comprise or consist of a coordination complex, respectively an inverse coordination complex, as described above in detail.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

In case that the HTL does not comprise an (inverse) coordination complex in accordance with the invention, but the (inverse) coordination complex is comprised in the HIL and/or the CGL, the HTL may be formed by any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4', 4"-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of the electron blocking layer (EBL) is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

The electron blocking layer may comprise a compound of formula Z below (Z).

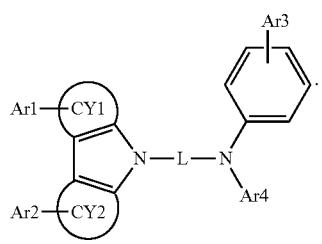

(Z)

In Formula Z, CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazol-2-yl)benzene (TPBI), 3-tert-butyl-9,10-di-2-naphthanthracene (TBADN), distyrylarylene (DSA), bis(2-(2-hydroxyphenyl)benzo-thiazolate) zinc $(Zn(BTZ)_2)$, G3 below, AND, Compound 1 below, and Compound 2 below.

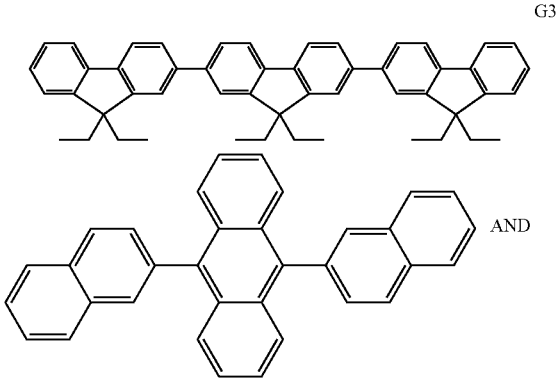

G3

AND

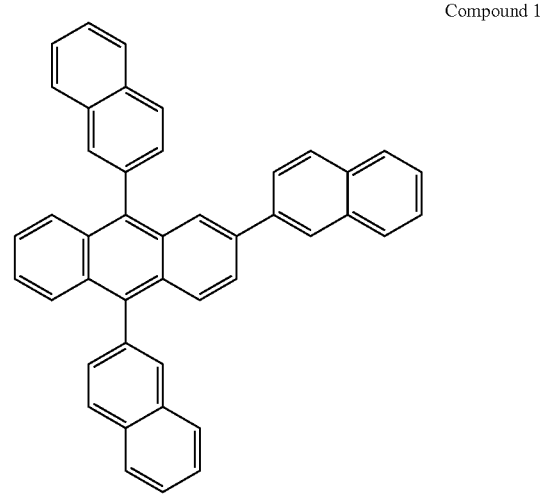

Compound 1

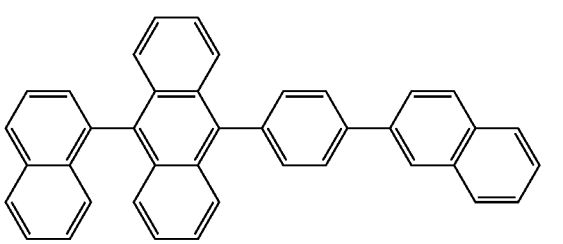

Compound 2

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, $Ir(piq)_3$, and Btp2Ir(acac), but are not limited thereto. These compounds are phosphorescent emitters, however, fluorescent red emitter dopants could also be used.

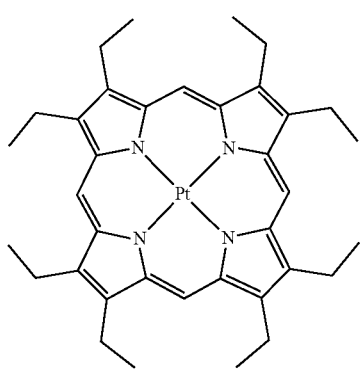

PtOEP

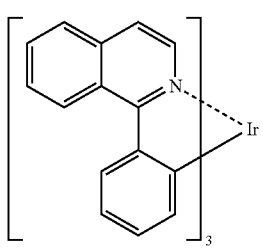

Ir(piq)₃

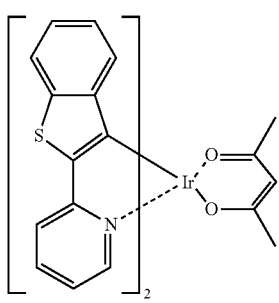

Btp₂Ir(acac)

Examples of phosphorescent green emitter dopants are Ir(ppy)₃ (ppy=phenylpyridine), Ir(ppy)₂(acac), Ir(mpyp)₃ are shown below. Compound 3 is an example of a fluorescent green emitter and the structure is shown below.

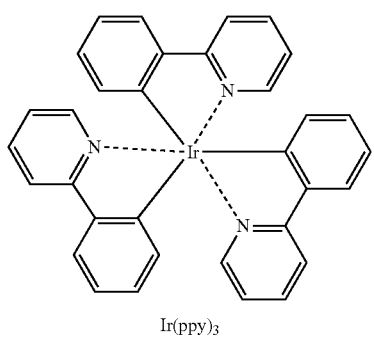

Ir(ppy)₃

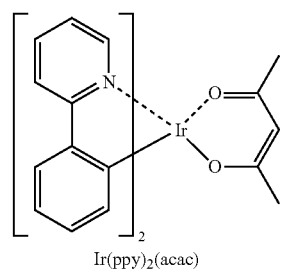

Ir(ppy)₂(acac)

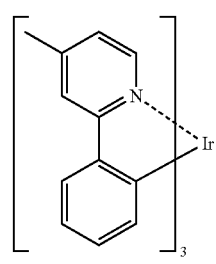

Ir(mpyp)₃

Compound 3

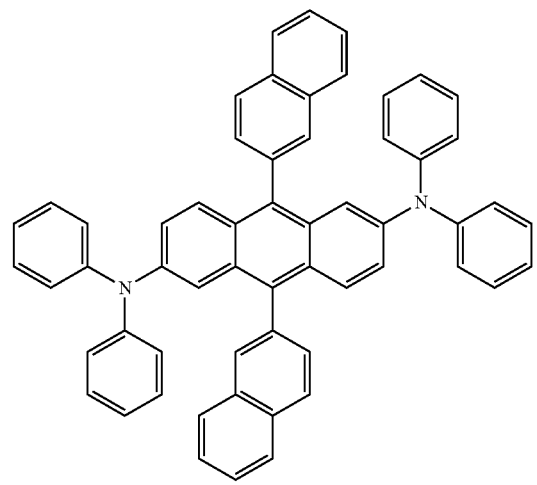

Examples of phosphorescent blue emitter dopants are F2Irpic, (F2ppy)2Ir(tmd) and Ir(dfppz)₃, ter-fluorene, the structures are shown below. 4.4'-bis(4-diphenyl amiostyryl) biphenyl (DPAVBi), 2,5,8,11-tetra-tert-butyl perylene (TBPe), and Compound 4 below are examples of fluorescent blue emitter dopants.

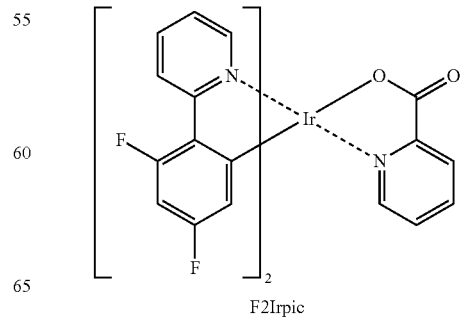

F2Irpic

-continued

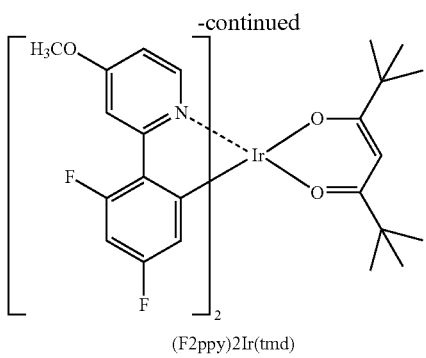

(F2ppy)2Ir(tmd)

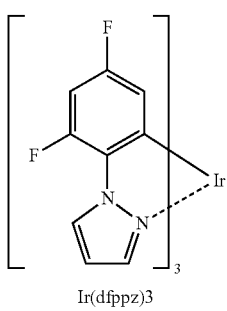

Ir(dfppz)3

Compound 4

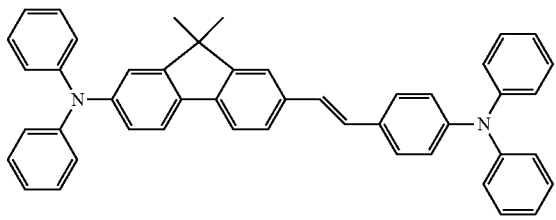

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The OLED according to the present invention may contain an electron transport layer (ETL).

According to various embodiments, the OLED may comprise an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the electronic device may comprise an organic electron transport matrix (ETM) material. Further, the electron transport layer may comprise one or more n-dopants. Suitable compounds for the ETM are not particularly limited. In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaromatic structural moieties, as disclosed e.g. in documents EP 1 970 371 A1 or WO 2013/079217 A1.

Electron Injection Layer (EIL)

The optional EIL, which may facilitates injection of electrons from the cathode, may be formed on the ETL, preferably directly on the electron transport layer. Examples of materials for forming the EIL include lithium 8-hydroxyquinolinolate (LiQ), LiF, NaCl, CsF, $Li_2O$, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode is formed on the EIL if present. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxides, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer/Hole Generating Layer

The charge generation layer (CGL) may be composed of a double layer.

Typically, the charge generation layer is a pn junction joining a n-type charge generation layer (electron generating layer) and a hole generating layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generating layers are used in tandem devices, for example, in tandem OLEDs comprising, between two electrodes, two or more emission layers. In aa tandem OLED comprising two emission layers, the n-type charge generation layer provides electrons for the first light emission layer arranged near the anode, while the hole generating layer provides holes to the second light emission layer arranged between the first emission layer and the cathode.

In accordance with the invention, it may be provided that the electronic device comprises a hole injection layer as well as a hole generating layer. If the hole injection layer comprises the (inverse) coordination complex, it is not obligatory that also the hole generating layer comprises the (inverse) coordination complex. In such a case, the hole generating layer can be composed of an organic matrix material doped with p-type dopant. Suitable matrix materials for the hole generating layer may be materials conventionally used as hole injection and/or hole transport matrix materials. Also, p-type dopant used for the hole generating layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-di-amine (TPD) and N,N',N'-tetranaphthyl-benzidine (TNB).

In a preferred embodiment, the hole generating layer consists of the coordination complex or the inverse coordination complex as defined above in detail.

The n-type charge generation layer can be layer of a neat n-dopant, for example of an electropositive metal, or can consist of an organic matrix material doped with the n-dopant. In one embodiment, the n-type dopant can be alkali metal, alkali metal compound, alkaline earth metal, or alkaline earth metal compound. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline)aluminum, benzazole derivatives, and silole derivatives.

In one embodiment, the n-type charge generation layer may include compounds of the following Chemical Formula X.

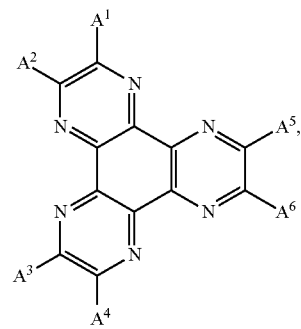

(X)

wherein each of A1 to A6 may be hydrogen, a halogen atom, nitrile (—CN), nitro (—NO2), sulfonyl (—SO2R), sulfoxide (—SOR), sulfonamide (—SO2NR), sulfonate (—SO3R), trifluoromethyl (—CF3), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heteroring, substituted or unsubstituted aryl, substituted or unsubstituted mono- or di-arylamine, substituted or unsubstituted aralkylamine, or the like. Herein, each of the above R and R' may be substituted or unsubstituted C1-C60 alkyl, substituted or unsubstituted aryl, or a substituted or unsubstituted 5- to 7-membered heteroring, or the like.

An example of such n-type charge generation layer may be a layer comprising CNHAT

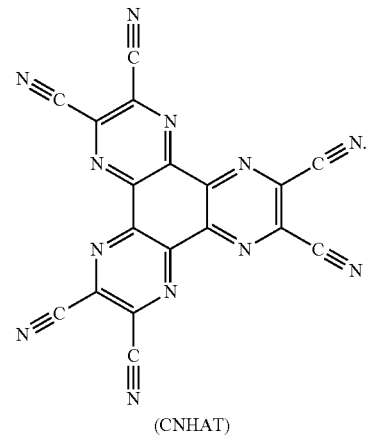

(CNHAT)

The hole generating layer is arranged on top of the n-type charge generation layer.

Organic Light-Emitting Diode (OLED)

According to one aspect of the present invention, there is provided an organic light-emitting diode (OLED) comprising: a substrate; an anode electrode formed on the substrate; a hole injection layer, a hole transport layer, an emission layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, an electron injection layer, and a cathode electrode.

According to various embodiments of the present invention, there may be provided OLEDs layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

For example, the OLED according to FIG. 2 may be formed by a process, wherein on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Details and Definitions of the Invention

The present invention is related to an electronic device. The device comprises a first electrode and a second electrode. Between the first electrode and the second electrode, at least one hole injection layer and/or at least one hole transport layer and/or at least one hole generating layer is arranged. That is, the electronic device may only comprise a hole injection layer between the first electrode and the second electrode. Likewise, the inventive electronic device may only comprise the hole transport layer between the first electrode and the second electrode. Likewise, the inventive electronic device may only comprise the hole generating layer between the first electrode and the second electrode. Likewise, the electronic device may comprise only two or all three of the above hole injection, hole transport or hole generating layers between the first electrode and the second electrode. In case that electronic device only comprises the hole injection layer (and not the hole generating layer) it is provided that the hole injection layer consists of the (inverse) coordination complex. Likewise, in the case that the electronic device comprises only the hole generating layer (and not the hole injection layer) it is provided that the hole generating layer consists of the (inverse) coordination complex. In case that the electronic device comprises both the hole injection layer and the hole generating layer, it may be provided that only the hole injection layer consists of the (inverse) coordination complex, that only the hole generating layer consists of the (inverse) coordination complex or that both the hole injection layer and the hole generating layer consist of the (inverse) coordination complex.

In the above definition of the invention, reference is made to the electronegativity values according to Allen. According to Allen, the electronegativity of an atom is related to the average energy of the valence electrons in a free atom thereof. The electronegativity values according to Allen are as follows. For lanthanide elements La—Yb, it is assumed that Allen electronegativity is less than 1.15, for Th and U, it is assumed that Allen electronegativity is less than 1.5.

| Electronegativity using the Allen scale | | | | | | | | | | | | | | | | | | |
|---|---|---|---|---|---|---|---|---|---|---|---|---|---|---|---|---|---|---|
| | Group | | | | | | | | | | | | | | | | | |
| Period | 1 | 2 | 3 | 4 | 5 | 6 | 7 | 8 | 9 | 10 | 11 | 12 | 13 | 14 | 15 | 16 | 17 | 18 |
| 1 | H 2.300 | | | | | | | | | | | | | | | | | He 4.160 |
| 2 | Li 0.912 | Be 1.576 | | | | | | | | | | | B 2.051 | C 2.544 | N 3.066 | O 3.610 | F 4.193 | Ne 4.787 |
| 3 | Na 0.869 | Mg 1.293 | | | | | | | | | | | Al 1.613 | Si 1.916 | P 2.253 | S 2.589 | Cl 2.869 | Ar 3.242 |
| 4 | K 0.734 | Ca 1.034 | Sc 1.19 | Ti 1.38 | V 1.53 | Cr 1.65 | Mn 1.75 | Fe 1.80 | Co 1.84 | Ni 1.88 | Cu 1.85 | Zn 1.59 | Ga 1.756 | Ge 1.994 | As 2.211 | Se 2.424 | Br 2.685 | Kr 2.966 |
| 5 | Rb 0.706 | Sr 0.963 | Y 1.12 | Zr 1.32 | Nb 1.41 | Mo 1.47 | Tc 1.51 | Ru 1.54 | Rh 1.56 | Pd 1.58 | Ag 1.87 | Cd 1.52 | In 1.656 | Sn 1.824 | Sb 1.984 | Te 2.158 | I 2.359 | Xe 2.582 |
| 6 | Cs 0.659 | Ba 0.881 | Lu 1.09 | Hf 1.16 | Ta 1.34 | W 1.47 | Re 1.60 | Os 1.65 | Ir 1.68 | Pt 1.72 | Au 1.92 | Hg 1.76 | Tl 1.789 | Pb 1.854 | Bi 2.01 | Po 2.19 | At 2.39 | Rn 2.60 |
| 7 | Fr 0.67 | Ra 0.89 | | | | | | | | | | | | | | | | |

The term "hydrocarbyl group" as used herein shall be understood to encompass any organic group comprising carbon atoms, in particular organic groups, such as alkyl, aryl, heteroaryl, heteroalkyl, in particular such groups which are substituents usual in organic electronics.

The term "alkyl" as used herein shall encompass linear as well as branched and cyclic alkyl. For example, $C_3$-alkyl may be selected from n-propyl and iso-propyl. Likewise, C$_4$-alkyl encompasses n-butyl, sec-butyl and t-butyl. Likewise, C$_6$-alkyl encompasses n-hexyl and cyclo-hexyl.

The subscribed number n in C$_n$ relates to the total number of carbon atoms in the respective alkyl, arylene, heteroarylene or aryl group.

The term "aryl" as used herein shall encompass phenyl (C$_6$-aryl), fused aromatics, such as naphthalene, anthracene, phenanthrene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached.

The term "heteroaryl" as used herein refers to aryl groups in which at least one carbon atom is substituted by a heteroatom, preferably selected from N, O, S, B or Si.

The term "halogenated" refers to an organic compound in which one hydrogen atom thereof is replaced by a halogen atom. The term "perhalogenated" refers to an organic compound in which all of the hydrogen atoms thereof are replaced by halogen atoms. The meaning of the terms "fluorinated" and "perfluorinated" should be understood analogously.

The subscripted number n in Cn-heteroaryl merely refers to the number of carbon atoms excluding the number of heteroatoms. In this context, it is clear that a C$_3$ heteroarylene group is an aromatic compound comprising three carbon atoms, such as pyrazol, imidazole, oxazole, thiazole and the like.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the inventive organic semiconductive layer as well as with respect to the inventive compound, the compounds mentioned in the experimental part are most preferred.

The inventive electronic device may be an organic electroluminescent device (OLED) an organic photovoltaic device (OPV) or an organic field-effect transistor (OFET).

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED). A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

The energy levels of the highest occupied molecular orbital, also named HOMO, and of the lowest unoccupied molecular orbital, also named LUMO, are measured in electron volt (eV).

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is under-stood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

EMBODIMENTS OF THE INVENTIVE DEVICE

Figure 1:
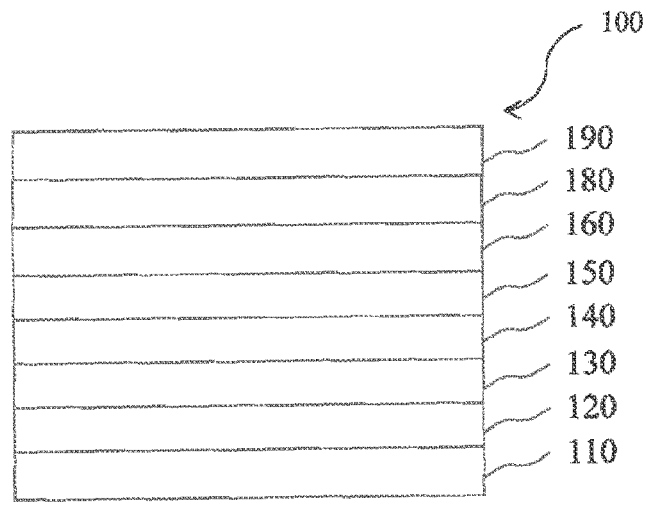
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed directly on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
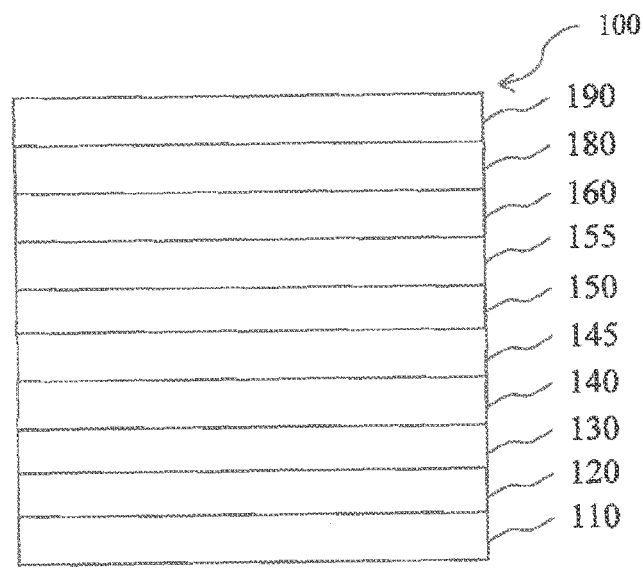
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 3:
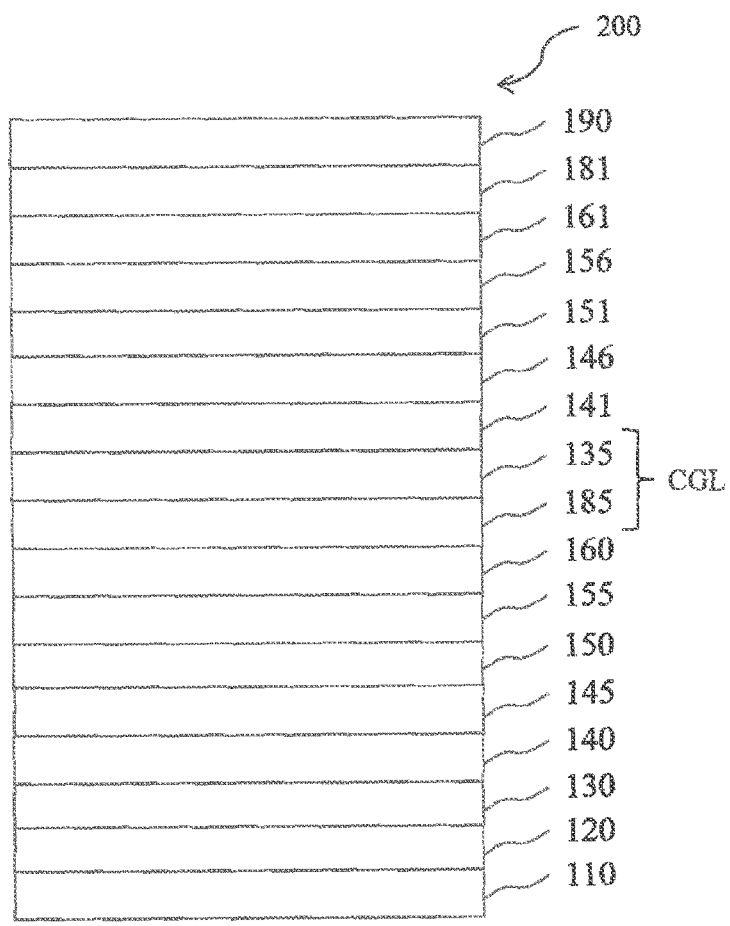
FIG. 3 is a schematic sectional view of a tandem OLED comprising a charge generation layer, according to an exemplary embodiment of the present invention.
Figure 4:
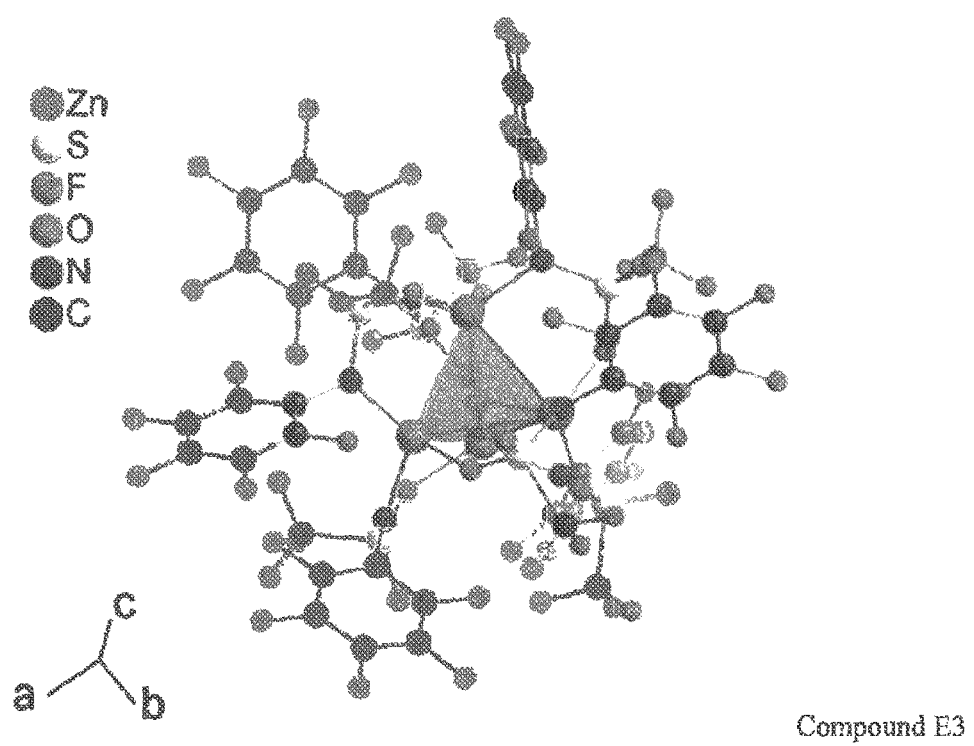
FIG. 4 shows the crystal structure of the inventive inverse coordination complex E3, having the summary formula $C_{42}F_{48}N_6O_{13}S_6Zn_4$.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer and a second emission layer.

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

EXPERIMENTAL PART

Preparation of Inventive Metal Complexes
Exemplary Compound E2
The Compound has been Prepared According to Scheme 1

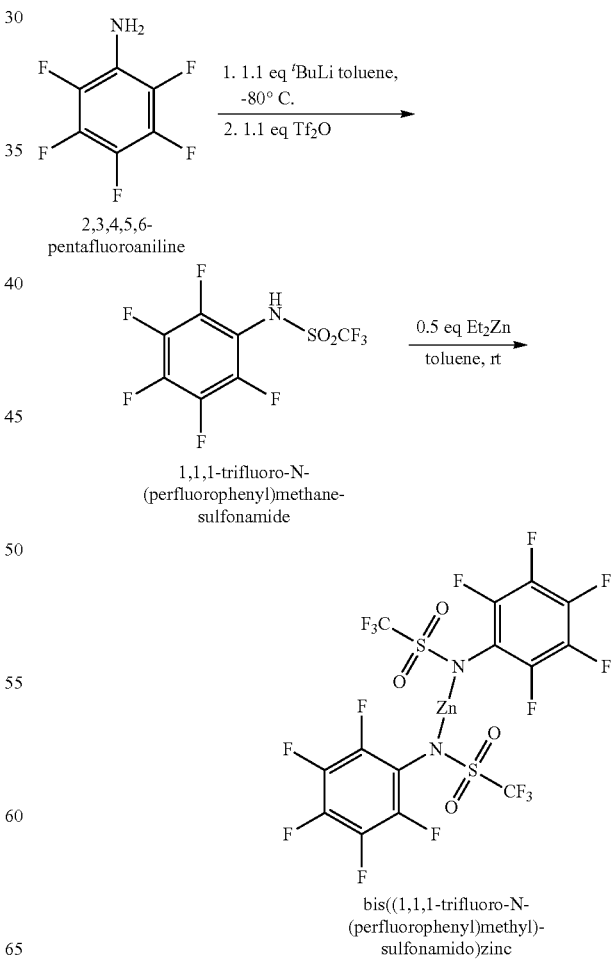

1. Step 1: Synthesis of 1,1,1-trifluoro-N-(perfluorophenyl)methanesulfonamide A 250 mL Schlenk flask was heated in vacuum and after cooling was purged with nitrogen. Perfluoroaniline was dissolved in 100 mL toluene and the solution was cooled to −80° C. A 1.7 M t-Butyllithium solution was added dropwise via syringe over 10 min. The reaction solution changed from clear to cloudy and was stirred for 1 h at −80° C. After that, the solution was allowed to warm to −60° C. and 1.1 eq of trifluoromethanesulfonic anhydride was added dropwise to the solution. Then the cooling bath was removed and the reaction mixture was allowed to warm slowly to ambient temperature and stirred overnight, whereby the color changed to light orange. Additionally, a white solid formed. The precipitated by-product lithium trifluoromethanesulfonate was filtered off by suction filtration over a sintered glass filter and washed with 2×30 mL toluene and 30 mL n-hexane. The orange filtrate was evaporated and dried in high vacuum forming crystals. The crude product was then purified by bulb-to-bulb distillation (135° C. @ 1.2×10$^{-1}$ mbar) resulting in a crystalline colorless solid (main fraction).

$^1$H NMR [d$^6$-DMSO, ppm] δ: 13.09 (s, 1H, N–H).

$^{13}$C{$^1$H} NMR [d$^6$-DMSO, ppm] δ: 116.75 (m, Ci-C6F5), 120.74 (q, $^1J_{CF}$=325 Hz, CF$_3$), 136.39, 138.35 (2m, $^2J_{CF}$=247 Hz, m-C6F5), 137.08, 139.06 (2m, $^2J_{CF}$=247 Hz, p-C6F5), 142.98, 144.93 (2m, $^2J_{CF}$=247, Hz o-C6F5).

$^{19}$F NMR [d$^6$-DMSO, ppm] δ: −77.45 (m, CF$_3$), −148.12 (m, C$_6$F$_5$), −160.79 (m, p-C$_6$F$_5$), −164.51 (m, C$_6$F$_5$).

ESI-MS: m/z-neg=314 (M−H).

EI-MS: m/z=315 (M), 182 (M−SO$_2$CF$_3$), 69 (CF$_3$).

Step 2: Synthesis of bis((1,1,1-trifluoro-N-(perfluorophenyl)methyl)-sulfonamido)zinc A 100 mL Schlenk flask was heated in vacuum and after cooling was purged with nitrogen. 1,1,1-Trifluoro-N-(perfluorophenyl)methanesulfonamide was dissolved in 10 mL toluene and 0.5 eq of diethylzinc in hexane was added dropwise to the solution via syringe at ambient temperature. During the addition a fog was forming and the reaction solution became jelly and cloudy. The solution was stirred for further 30 min at this temperature. After that, 30 mL n-hexane were added and a white precipitate formed, which was filtered over a sintered glass filter (pore 4) under inert atmosphere. The filter cake was twice washed with 15 mL n-hexane and dried in high vacuum at 100° C. for 2 h Yield: 660 mg (0.95 mmol, 60% based on 1,1,1-trifluoro-N-perfluorophenyl)methanesulfonamide) as a white solid.

$^{13}$C{$^1$H} NMR [d$^6$-DMSO, ppm] δ: 121.68 (q, $^1J_{CF}$=328 Hz, CF$_3$), 123.56 (m, Ci-C6F5), 133.98, 135.91 (2m, $^2J_{CF}$=243 Hz, p-C6F5), 136.15, 138.13 (2m, $^2J_{CF}$=249 Hz, m-C6F5), 142.33, 144.24 (2m, $^2J_{CF}$=240, Hz o-C$_6$F$_5$).

$^{19}$F NMR [d$^6$-DMSO, ppm] δ: −77.52 (m, CF$_3$), −150.43 (m, C$_6$F$_5$), −166.77 (m, C$_6$F$_5$), −168.23 (m, p-C$_6$F$_5$).

ESI-MS: m/z-neg=314 (M−Zn−L).

EI-MS: m/z=692 (M), 559 (M−SO$_2$CF$_3$) 315 (C$_6$F$_5$NHSO$_2$CF$_3$), 182 (C$_6$F$_5$NH), 69 (CF$_3$).

Exemplary Compound E3

9.1 g E2 has been sublimed at the temperature 240° C. and pressure 10$^{-3}$ Pa. yield 5.9 g (65%).

The sublimed material formed colorless crystals. One crystal of an appropriate shape and size (0.094×0.052×0.043 mm$^3$) has been closed under Ar atmosphere in a glass capillary and analyzed on Kappa Apex II diffractometer (Bruker-AXS, Karlsruhe, Germany) with monochromatic X-ray radiation from a source provided with molybdenum cathode (λ=71.073 pm). Overall 37362 reflexions were collected within the theta range 1.881 to 28.306°.

The structure was resolved by direct method (SHELXS-97, Sheldrick, 2008) and refined with a full-matrix least-squares method (SHELXL-2014/7, Olex2 (Dolomanov, 2017).

Exemplary Compound E4

Step 1: Synthesis of N-(3,5-bis(trifluoromethyl)phenyl)-1,1,1-trifluoromethanesulfonamide

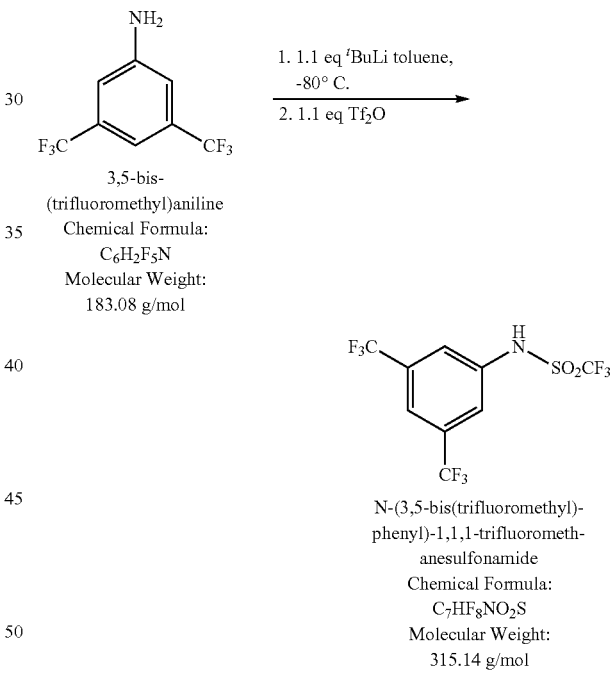

A 100 mL Schlenk flask was heated in vacuum and after cooling was purged with nitrogen. The 3,5-bis(trifluoromethyl)aniline was dissolved in 40 mL toluene and the solution was cooled to −80° C. The t-Butyllithium solution was added dropwise via syringe over 15 min. The resulting yellow solution was stirred for 1.5 h at −80° C. The trifluoromethanesulfonic anhydride was added at −80° C. The cooling bath was removed and the reaction mixture was allowed to warm slowly to ambient temperature and stirred overnight. The reaction was then cooled in an ice-bath to <10° C. and 70 ml 10% aqueous H2SO4-Solution was added slowly. The aqueous phase was extracted three times with 75 mL diethyl ether and the combined organic phases were washed with 100 mL water, dried over sodium sulphate and the solvent removed under reduced pressure. The resulting brownish oil was distilled from bulb to bulb at 120° C. and 2e–02 mbar.

Yield: 5.23 g (83% based on anhydride); slightly yellow oil, crystallizes slowly Step 2: Synthesis of bis((N-(3,5-bis(trifluoromethyl)phenyl)-1,1,1-trifluoromethyl)sulfonamido)zinc Scheme 3 Synthesis of bis((N-(3,5-bis(trifluoromethyl)phenyl)-1,1,1-trifluoromethyl)sulfonamido)zinc

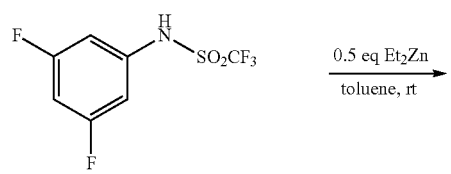

N-(3,5-difluorophenyl)-1,1,1-trifluoromethane-sulfonamide
Chemical Formula: $C_7HF_8NO_2S$
Molecular Weight: 315.14 g/mol

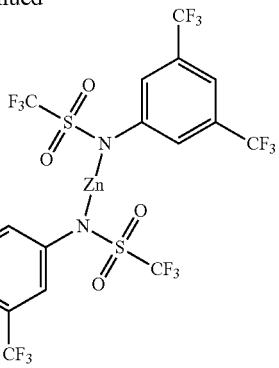

bis((N-(3,5-bis(trifluoromethyl)phenyl)-1,1,1-trifluoromethyl)sulfonamido)zinc
Chemical Formula: $C_{14}F_{16}N_2S_2O_4Zn$
Molecular Weight: 693.64 g/mol N-(3,5-bis(trifluoromethyl)phenyl)-1,1,1-trifluoromethanesulfonamide was dissolved in toluene in a dried Schlenk flask. A 1 M solution of diethylzine in toluene was added dropwise and the resulting thick suspension was stirred overnight. The solid was filtered off under inert conditions and washed with 20 ml dry hexane an dried under high vacuum overnight.

Yield: 1.12 g (69%); white solid

By vacuum sublimation, E4 converted in compound E5 having composition $C_{54}H_{18}F_{54}N_6O_{13}S_6Zn_4$ and forming crystalline phase described above.

Further examples of inventive compounds were prepared analogously:

E6, yield 99% based on 1,1,1-trifluoro-N-(perfluoropyridin-4-yl)methanesulfon-amide, according to Scheme 4

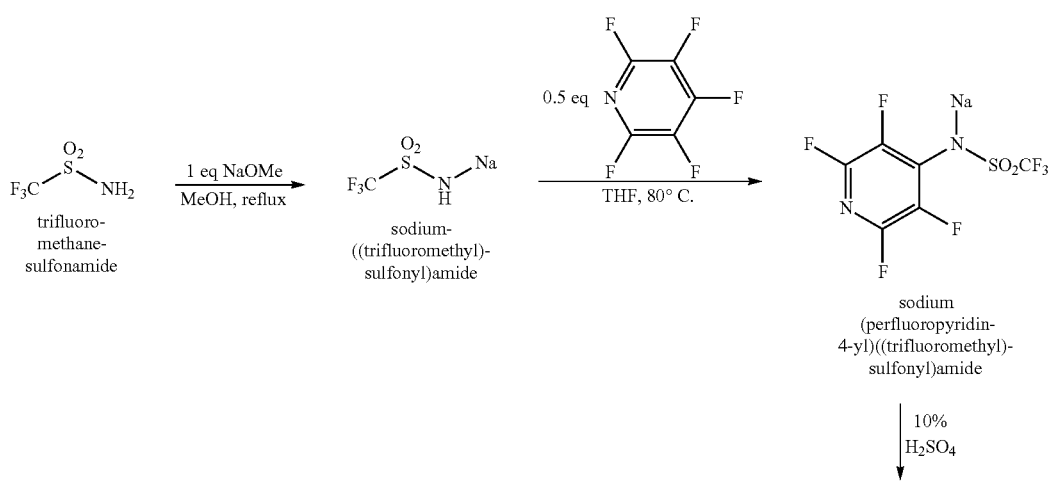

-continued
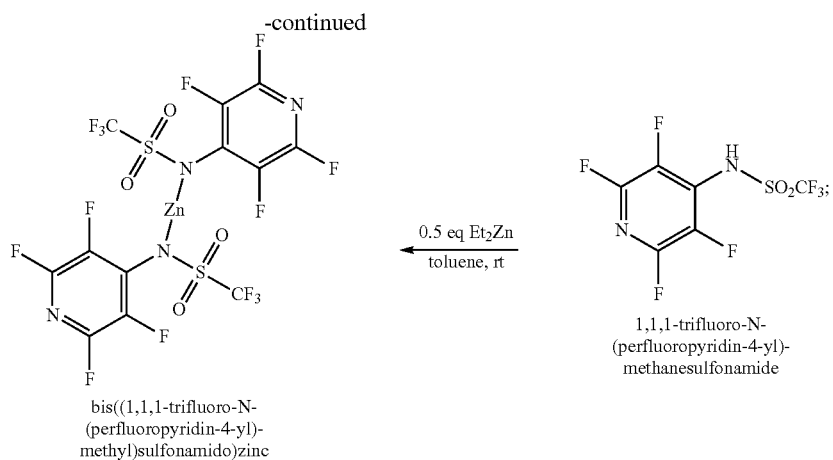
E8, yield 81% based on 1,1,1-trifluoro-N-(2,5,6-trifluoro-pyrimidin-4-yl)methanesulfonamide) according to Scheme 5
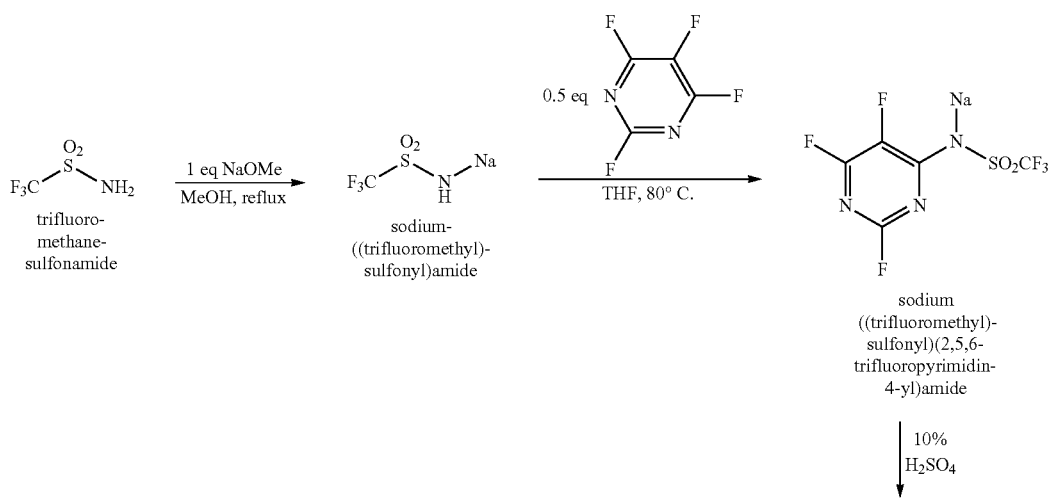
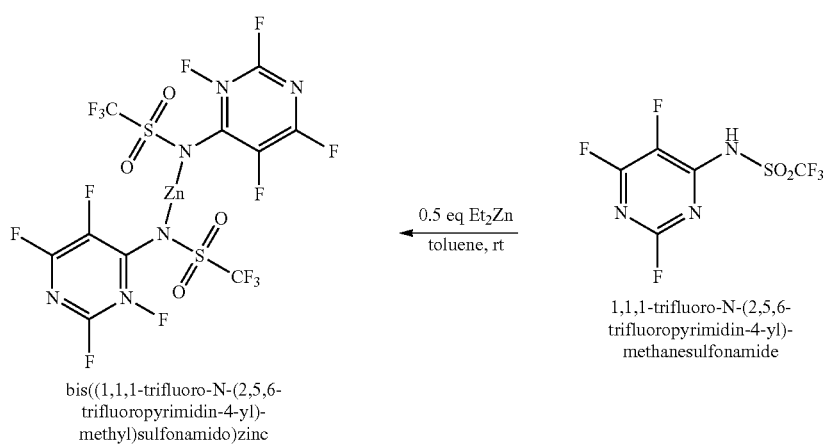

E10, yield 92% based on 1,1,2,2,2-pentafluoro-N-(perfluoro-pyridin-4-yl)ethane-1-sulfonamide, according to Scheme 6
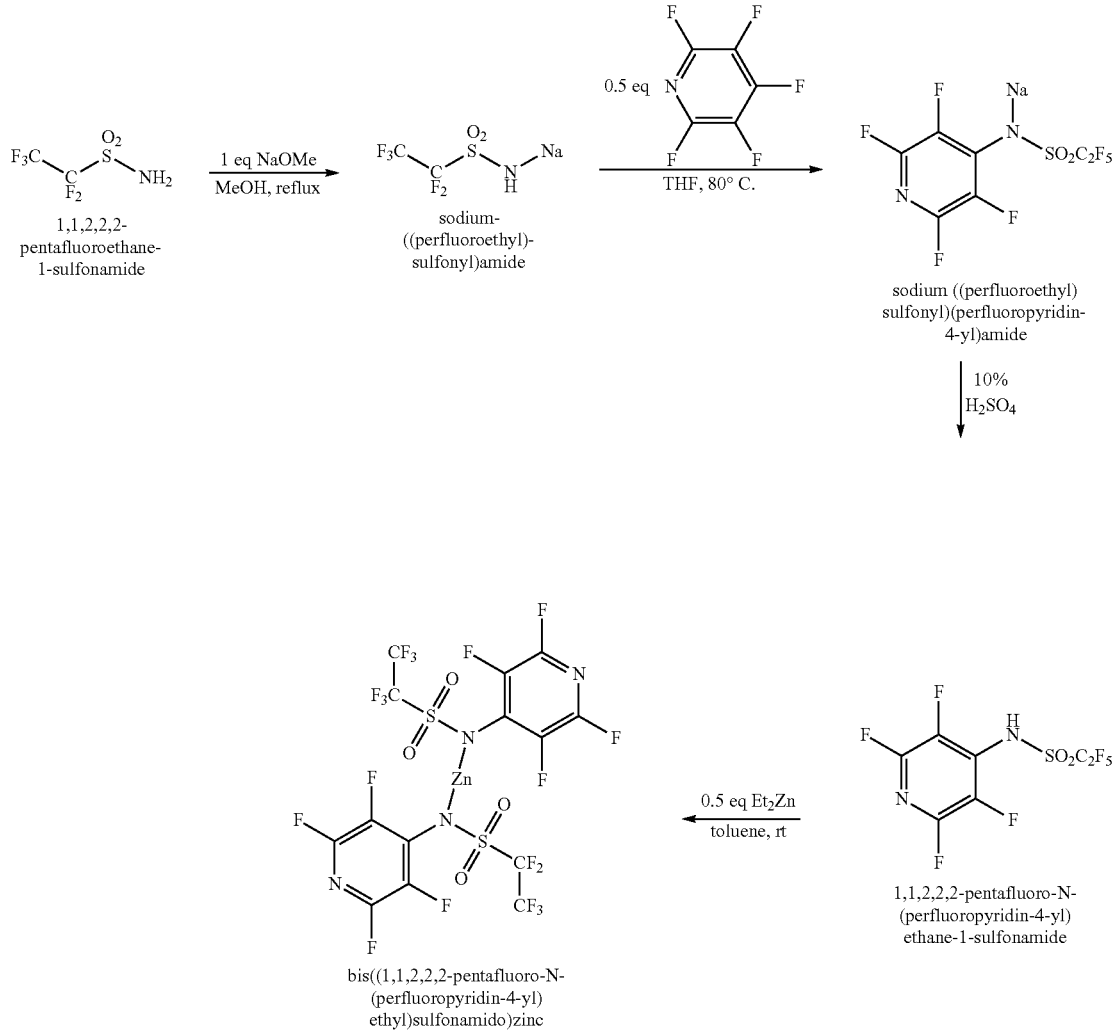
E12, yield 80%, according to Scheme 7
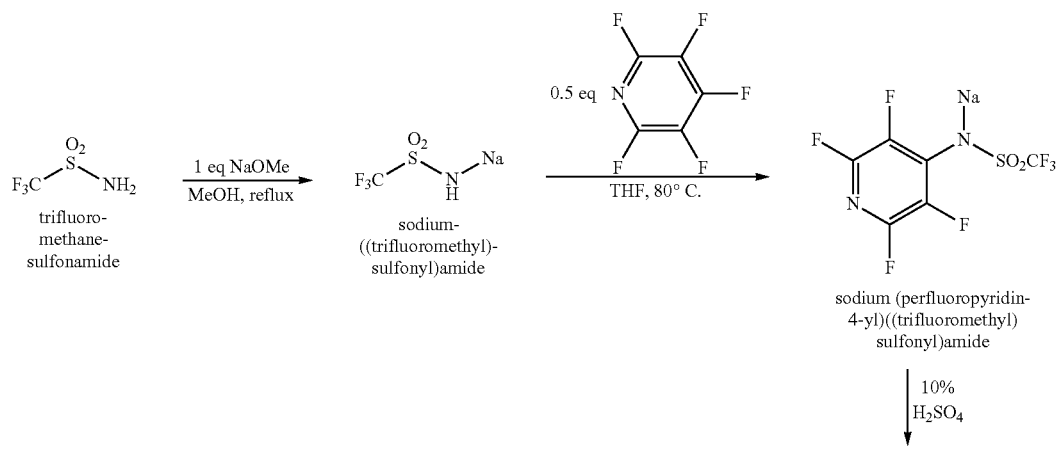

-continued
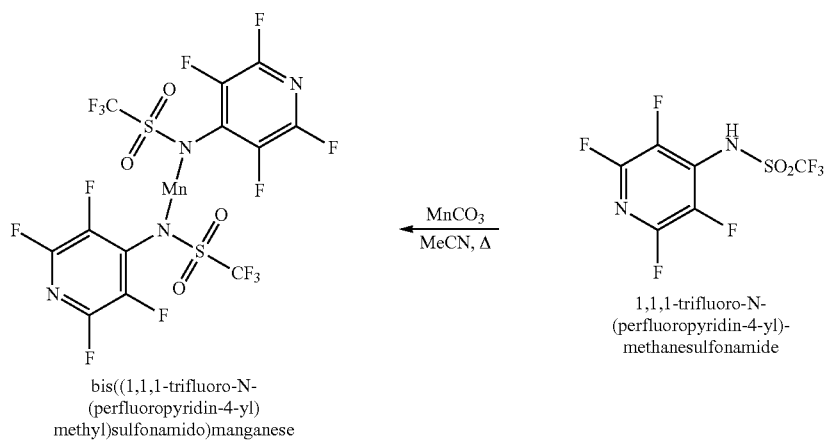
E14, yield 90%, according to Scheme 8
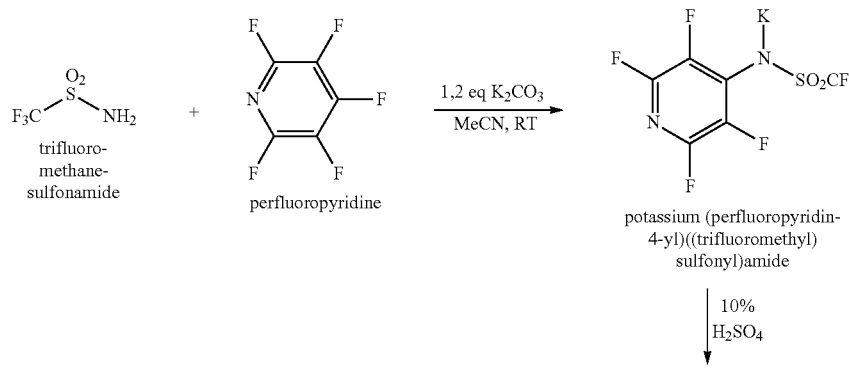
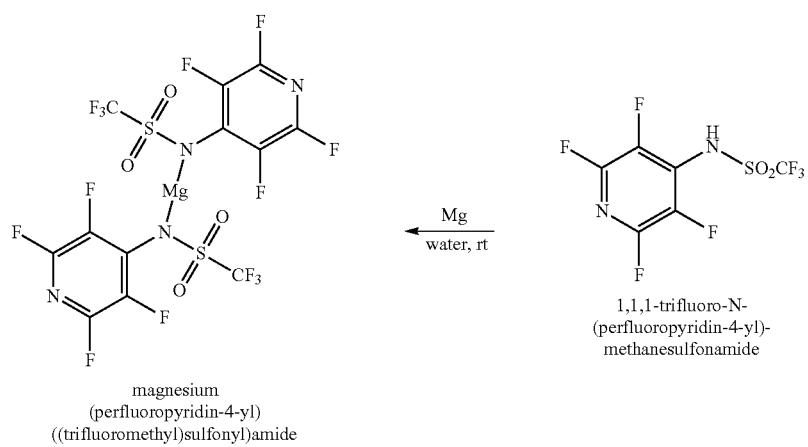

E16, yield 85%, according to Scheme 9
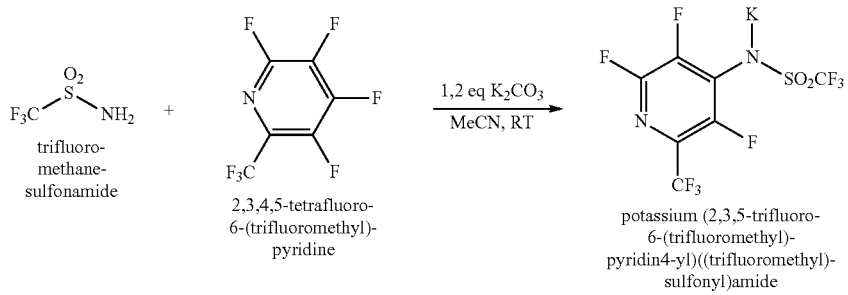
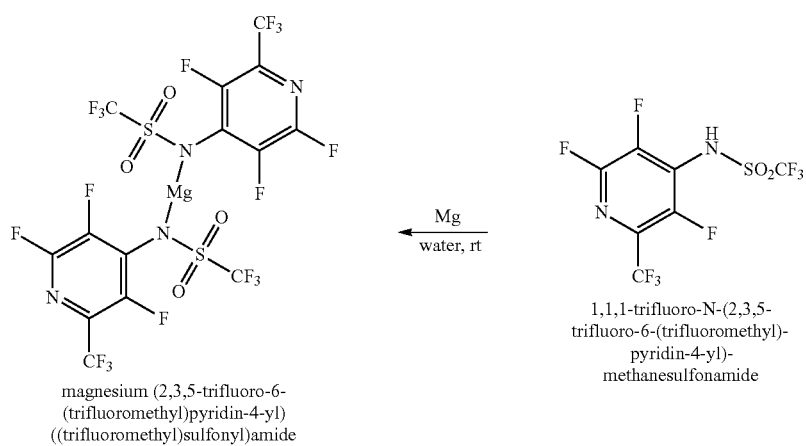
E18, yield 76%, according to Scheme 10
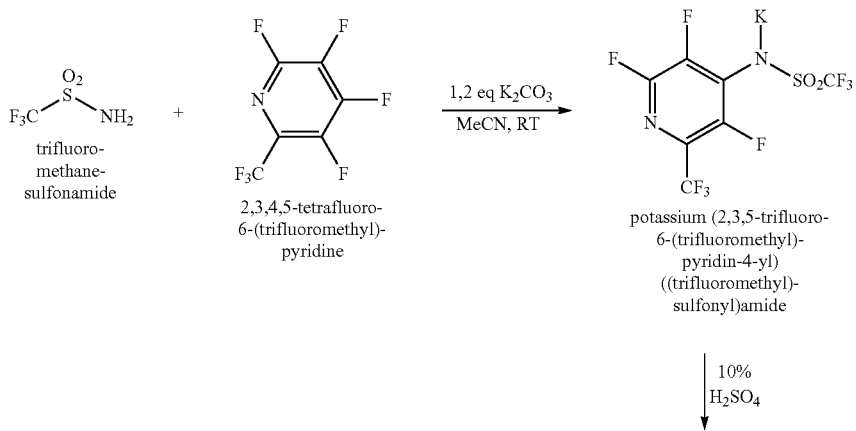

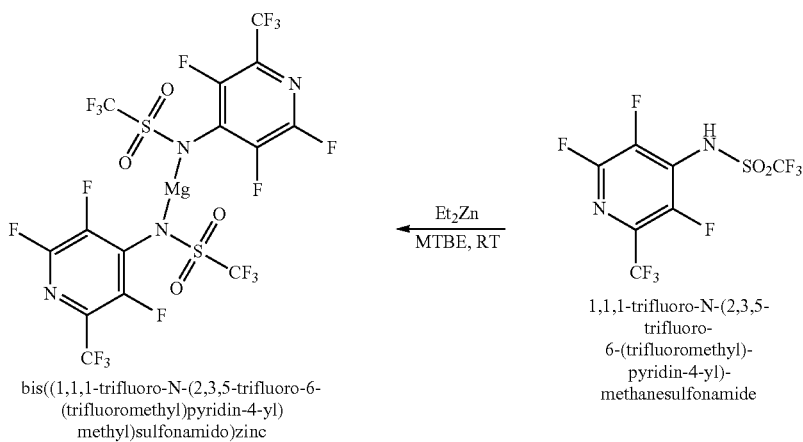
E20, yield 82%, according to Scheme 11
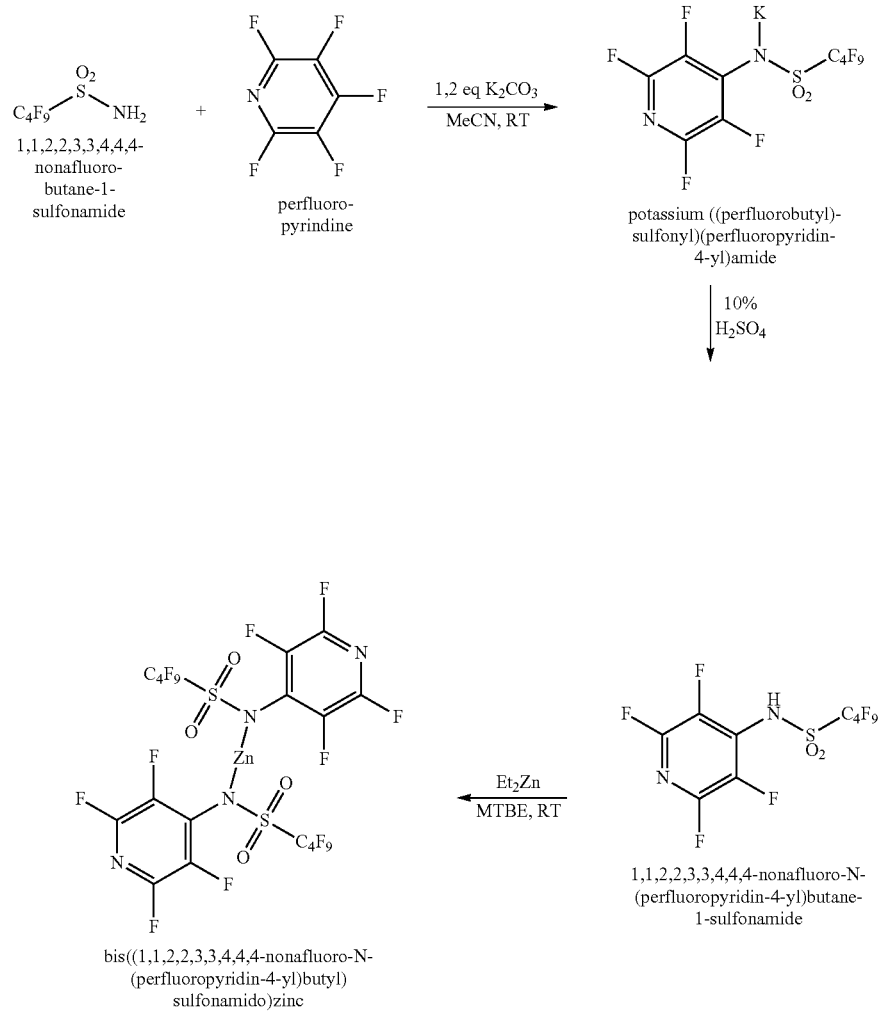

E22, yield 68%, according to Scheme 12

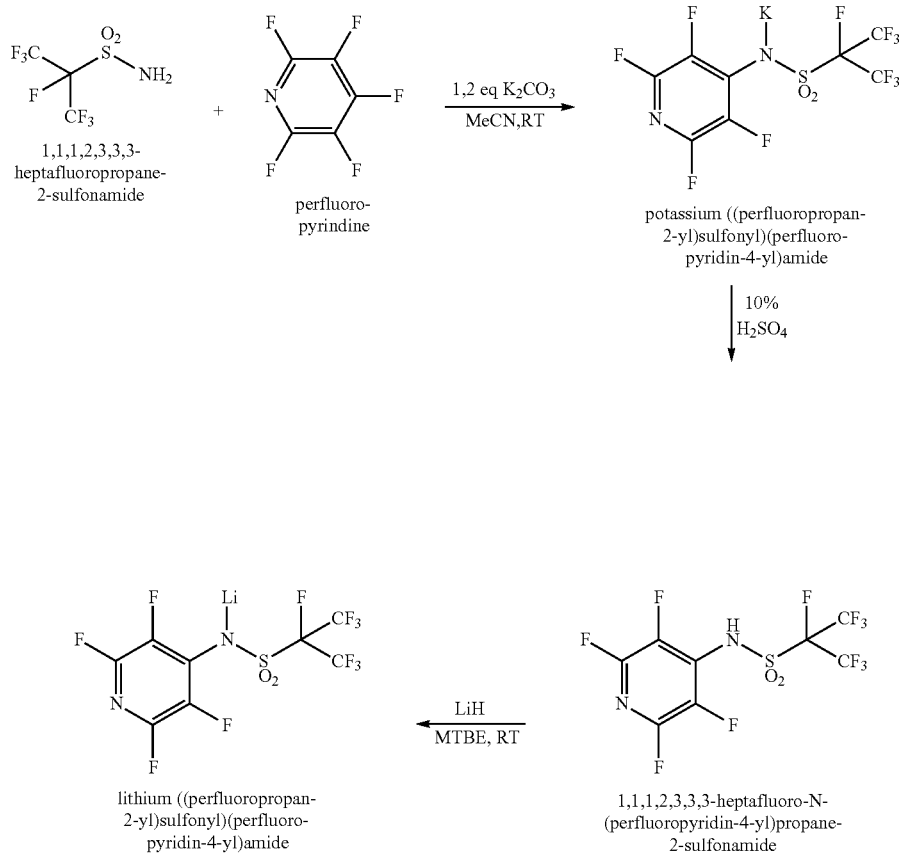

E24, yield 67%, according to Scheme 13

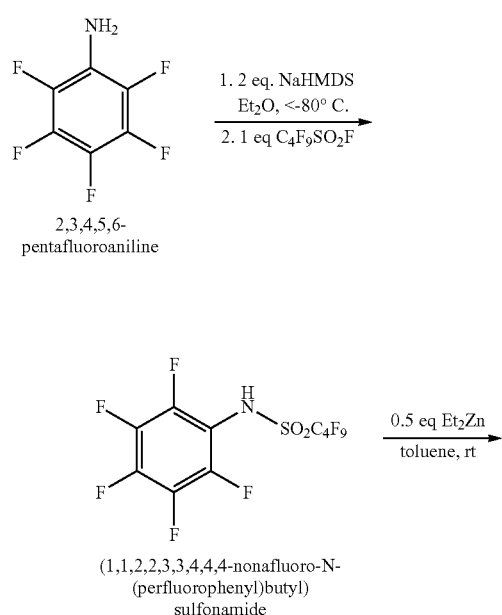

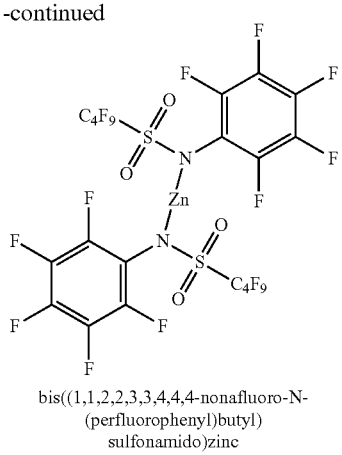

bis((1,1,2,2,3,3,4,4,4-nonafluoro-N-(perfluorophenyl)butyl)sulfonamido)zinc

Device Experiments
Generic Procedures

A 15 Ω/cm² glass substrate with 90 nm ITO (available from Corning Co.) was cut to a size of 150 mm×150 mm×0.7 mm, ultrasonically cleaned with isopropyl alcohol for 5 minutes and then with pure water for 5 minutes, and cleaned again with UV ozone for 30 minutes, to prepare a first electrode.

The organic layers are deposited sequentially on the ITO layer at $10^{-5}$ Pa, see Table 1 and 2 for compositions and layer thicknesses. In the Tables 1 to 3, c refers to the concentration, and d refers to the layer thickness.

Then, the cathode electrode layer is formed by evaporating aluminum at ultra-high vacuum of $10^{-7}$ mbar and deposing the aluminum layer directly on the organic semiconductor layer. A thermal single co-evaporation of one or several metals is performed with a rate of 0, 1 to 10 nm/s (0.01 to 1 Å/s) in order to generate a homogeneous cathode electrode with a thickness of 5 to 1000 nm. The thickness of the cathode electrode layer is 100 nm.

The device is protected from ambient conditions by encapsulation of the device with a glass slide. Thereby, a cavity is formed, which comprises a getter material for further protection.

Current voltage measurements are performed at the temperature 20° C. using a Keithley 2400 source meter, and recorded in V.

Experimental Results

Materials Used in Device Experiments

The formulae of the supporting materials mentioned in both tables below are as follows:

F1 is

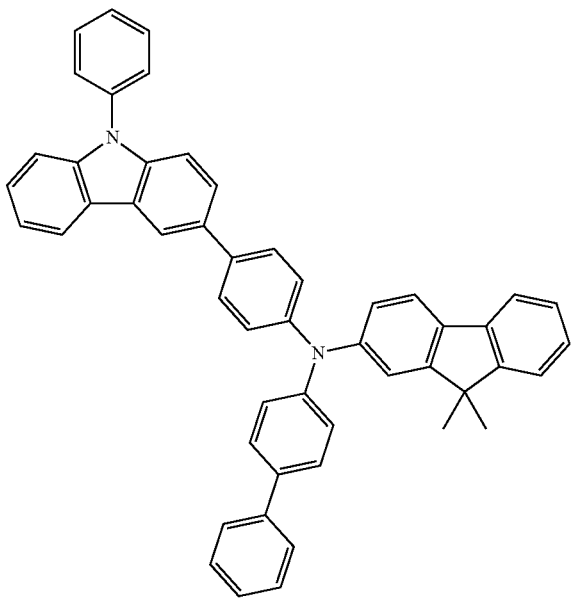 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

biphenyl-4-yl(9,9-diphenyl-9H-fluoren-2-yl)-[4-(9-phenyl-9H-carbazol-3-yl)phenyl]-amine, CAS 1242056-42-3;

F2 is

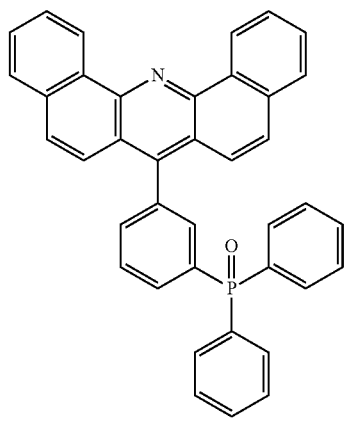 [SMILES: O=P(c1ccccc1)(c1ccccc1)c1cccc(-c2c3ccc4ccccc4c3nc3c2ccc2ccccc23)c1]

(3-(dibenzo[c,h]acridin-7-yl)phenyl)diphenylphosphine oxide, CAS 1440545-22-1;

F3 is

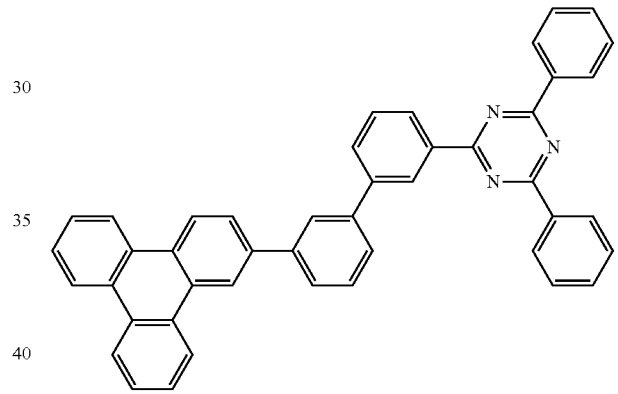

2,4-diphenyl-6-(3'-(triphenylen-2-yl)-[1,1'-biphenyl]-3-yl)-1,3,5-triazine, CAS 1638271-85-8;

F4 is

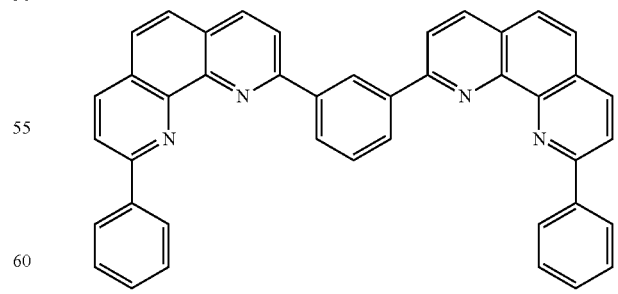

1,3-bis(9-phenyl-1,10-phenanthrolin-2-yl)benzene, CAS 721969-94-4;

PD-2 is

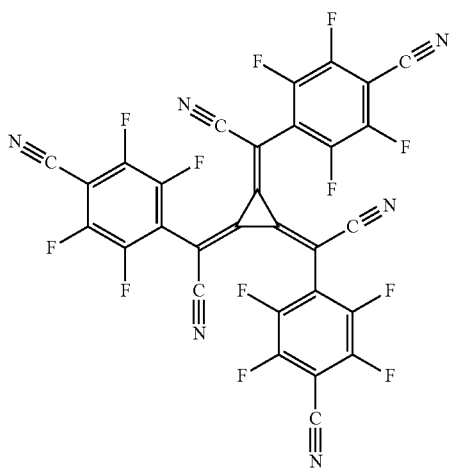 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

4,4',4"-((1E,1'E,1"E)-cyclopropane-1,2,3-triylidenetris(cyanomethanylylidene))tris(2,3,5,6-tetrafluorobenzonitrile), CAS 1224447-88-4.

LiQ is lithium 8-hydroxyquinolinolate; ZnPc is zinc phtalocyanine;

ABH-113 is an emitter host and NUBD-370 and DB-200 are blue fluorescent emitter dopants, all commercially available from SFC, Korea.

ITO is indium tin oxide.

Standard Procedures

Voltage Stability:

OLEDs are driven by constant current circuits. Those circuits can supply a constant current over a given voltage range. The wider the voltage range, the wider the power losses of such devices. Hence, the change of driving voltage upon driving needs to be minimized.

The driving voltage of an OLED is temperature dependent. Therefore, voltage stability needs to be judged in thermal equilibrium. Thermal equilibrium is reached after one hour of driving.

Voltage stability is measured by taking the difference of the driving voltage after 50 hours and after 1 hour driving at a constant current density. Here, a current density of 30 mA/cm² is used. Measurements are done at room temperature.

$dU[V]=U(50\ h, 30\ mA/cm^2)-U(1\ h, 30\ mA/cm^2)$

EXAMPLE 1

Use of a sulfonyl amide coordination complex as a neat hole injection layer in a blue OLED Table 1a schematically describes the model device.

TABLE 1a

| Material | c [wt %] | d [nm] |
|---|---|---|
| ITO | 100 | 90 |
| B2 or E3 | 100 | 3* |
| F1 | 100 | 120 |
| ABH113:NUBD370 | 97:3 | 20 |
| F2:LiQ | 50:50 | 36 |
| Al | 100 | 100 |

*E3 has been tested also as a layer only 1 nm thin.

The results are given in Table 1b

TABLE 1b

| | U* [V] | EQE* [%] | CIE-y* | U(50 h) − U(1 h) ** [V] |
|---|---|---|---|---|
| 3 nm B2 (reference) | 5.28 | 6.6 | 0.090 | 0.275 |
| 3 nm E3 | 5.38 | 5.7 | 0.094 | 0.246 |
| 1 nm E3 | 5.11 | 5.4 | 0.096 | 0.040 |

*j = 15 mA/cm²
** j = 30 mA/cm²

Neat layers of E3 provide an advantage of better voltage stability.

EXAMPLE 2

Use of a sulfonyl amide coordination complex as a p-dopant in a hole injection layer comprised in a blue OLED Table 2a schematically describes the model device.

TABLE 2a

| Material | c [wt %] | d [nm] |
|---|---|---|
| ITO | 100 | 90 |
| F1:p-dopant | 92:8 (mol %#) | 10 |
| F1 | 100 | 120 |
| ABH113:NUBD370 | 3 | 20 |
| F2:LiQ | 50 | 36 |
| Al | 100 | 100 | based on molar amount of metal atoms

The results are given in Table 2b

TABLE 2b

| | U* [V] | EQE* [%] | CIE-y* | U(50 h) − U(1 h) ** [V] |
|---|---|---|---|---|
| B2 (reference) | 8.06 | 7.1 | 0.095 | 0.639 |
| E3 | 5.15 | 5.7 | 0.094 | −0.015 |

*j = 15 mA/cm²
** j = 30 mA/cm²

It is shown that a p-dopant for a HIL comprising a hole transport matrix, complex E3 is advantageous over prior art compound B2.

Specifically, HILs p-doped with E3 provide an advantage of better voltage stability. The higher efficiency observed with B2-doped HIL is practically useless, due to impractically high operational voltage of such device. In this regard, the results show that E3 is well applicable also as a p-dopant, whereas B2 can be used only in neat thin hole injection layers.

EXAMPLE 3

Blue tandem OLED comprising a sulfonyl amide coordination complex as a neat hole generation layer Table 3a schematically describes the model device.

TABLE 3a

| Material | c [wt %] | d [nm] |
|---|---|---|
| ITO | 100 | 90 |
| F1:PD-2 | 92:8 | 10 |

TABLE 3a-continued

| Material | c [wt %] | d [nm] |
|---|---|---|
| F1 | 100 | 145 |
| ABH113:BD200 | 97:3 | 20 |
| F3 | 100 | 25 |
| F4:Li | 99:1 | 10 |
| ZnPc | 100 | 2 |
| p-dopant | 100 | 1 |
| F1 | 100 | 30 |
| ABH113:BD200 | 97:3 | 20 |
| F3 | 100 | 26 |
| F4:Li | 99:1 | 10 |
| Al | 100 | 100 |

The results are given in Table 3b

TABLE 3b

| | U* [V] | EQE* [%] | CIE-y* |
|---|---|---|---|
| 1 nm B2 (reference) | 10.65 | 6.3 | 0.066 |
| 1 nm E3 | 7.52 | 13.5 | 0.083 |

*j = 10 mA/cm²
**j = 30 mA/cm²

The results show that E3 is suitable as a neat CGL, whereas the device with a neat B2 CGL is poor.

EXAMPLE 4

Blue tandem OLED comprising a sulfonyl amide coordination complex as a p-dopant in a hole generation layer Table 4a schematically describes the model device.

TABLE 4a

| Material | c [wt %] | d [nm] |
|---|---|---|
| ITO | 100 | 90 |
| F1:PD-2 | 92:8 | 10 |
| F1 | 100 | 145 |
| ABH113:BD200 | 97:3 | 20 |
| F3 | 100 | 25 |
| F4:Li | 99:1 | 10 |
| ZnPc | 100 | 2 |
| F1:p-dopant | 84:16 (mol %)# | 10 |
| F1 | 100 | 30 |
| ABH113:BD200 | 97:3 | 20 |
| F3 | 100 | 26 |
| F4:Li | 99:1 | 10 |
| Al | 100 | 100 | based on molar amount of metal atoms

The results are given in Table 4b

TABLE 4b

| | U* [V] | EQE* [%] | CIE-y* | U(50 h) − U(1 h) ** [V] |
|---|---|---|---|---|
| B2 (reference) | 8.98 | 13.4 | 0.082 | |
| E3 | 7.75 | 14.2 | 0.087 | 0.094 |

*j = 10 mA/cm²
**j = 30 mA/cm²

The results are in accordance with Example 2 showing significantly better performance of E3 as a p-dopant in comparison with B2.

From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

The invention claimed is:

1. An electronic device comprising:
a hole injection layer and/or a hole transport layer and/or a hole generating layer;
wherein at least one of the hole injection layer, the hole transport layer, or the hole generating layer comprises a coordination complex having the general formula (I)

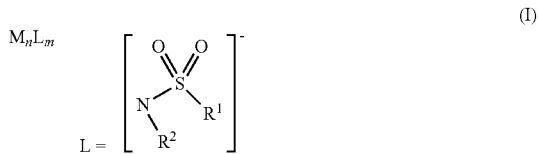

wherein—
M is Zn;
n is 1;
m is 2 or 3;
and $R^1$ and $R^2$ are independently selected from the group consisting of $C_1$ to $C_{30}$ hydrocarbyl and $C_2$ to $C_{30}$ heterocyclic group, wherein $R^1$ and $R^2$ are each substituted with substituents selected from the group consisting of CN, F, Cl, Br, and I, and the ratio of substituents:hydrogen in each of the $R^1$ and $R^2$ is ≥1.

2. The electronic device of claim 1, wherein the ratio of substituents:hydrogen in each of the $R^1$ and $R^2$ is ≥2.

3. The electronic device of claim 1, wherein $R^1$, $R^2$, or both $R^1$ and $R^2$ is perhalogenated.

4. The electronic device of claim 1, wherein the coordination complex having the general formula (I) is bis((1,1,1-trifluoro-N-(perfluorophenyl)methyl)-sulfonamido)zinc:

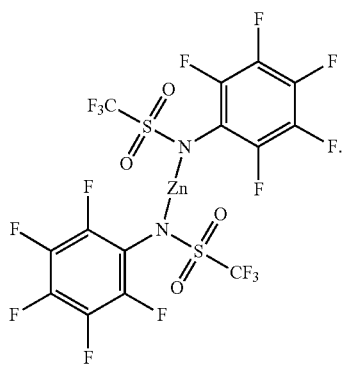

5. The electronic device of claim 1, wherein the coordination complex having the general formula (I) is bis((N-3,5-bis(trifluoromethyl)phenyl)-1,1,1-trifluoromethyl)sulfonamido)zinc:

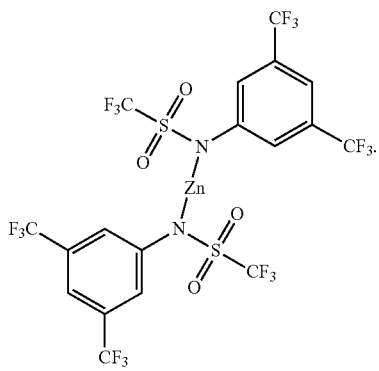

6. The electronic device of claim 1, wherein the coordination complex having the general formula (I) is bis((1,1,1-trifluoro-N-(perfluoropyridin-4-yl)-methyl)sulfonamido)zinc:

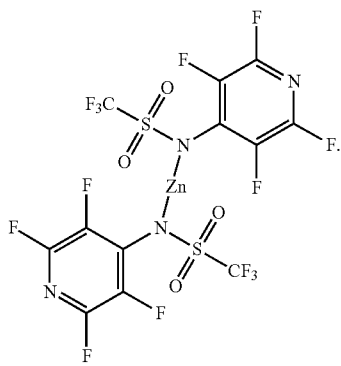

7. The electronic device of claim 1, wherein the coordination complex having the general formula (I) is bis((1,1,1-trifluoro-N-(2,5,6-trifluoropyrimidin-4-yl)-methyl)sulfonamido)zinc:

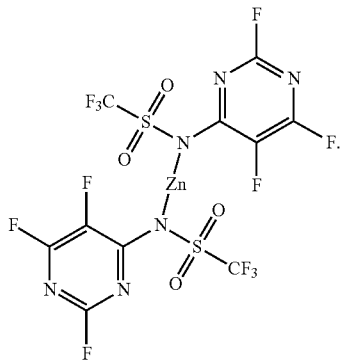

8. The electronic device of claim 1, wherein the coordination complex having the general formula (I) is bis((1,1,2,2,2-pentafluoro-N-(perfluoropyridin-4-yl)ethyl)sulfonamido)zinc:

9. The electronic device of claim 1, wherein the coordination complex having the general formula (I) is bis((1,1,1-trifluoro-N-(2,3,5-trifluoro-6-(trifluorometyl)pyridin-4-yl)methyl)sulfonamido)zinc:

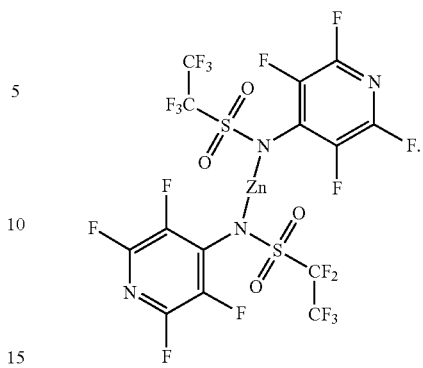

10. The electronic device of claim 1, wherein the coordination complex having the general formula (I) is bis((1,1,2,2,3,3,4,4,4-nonafluoro-N-(perfluoropyridin-4-yl)butyl)sulfonamido)zinc:

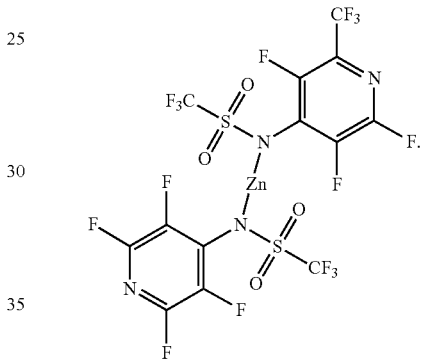

11. The electronic device of claim 1, wherein the coordination complex having the general formula (I) is bis((1,1,2,2,3,3,4,4,4-nonafluoro-N-(perfluorophenyl)butyl)sulfonamido)zinc:

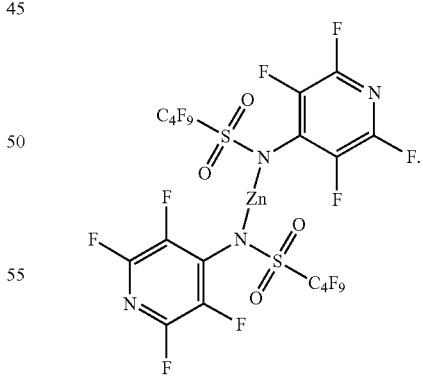

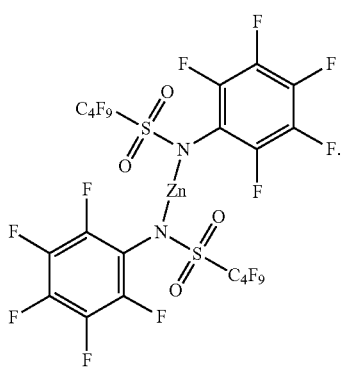

12. A method for preparing an electronic device according to claim 1, the method comprising heating the coordination complex of the general formula (I).

13. The method of claim 12, further comprising:

vaporizing the coordination complex of the general formula (I) to form a vapor of the coordination complex; and depositing the vapor of the coordination complex on a solid support.

14. The method of claim 13, wherein the vaporizing and the depositing, respectively, comprise co-vaporizing and co-depositing the coordination complex with a matrix material.

15. The method of claim 14, wherein the matrix material is an organic matrix material.

16. The method of claim 14, wherein the matrix material is selected from the group consisting of a triazine compound, a hydroxyquinoline derivative, a benzazole derivative, and a silole derivative.

\* \* \* \* \*